United States Patent
Muramatsu et al.

(10) Patent No.: US 10,854,852 B2
(45) Date of Patent: Dec. 1, 2020

(54) ORGANIC EL IMAGE DISPLAY DEVICE

(71) Applicant: FUJIFILM Corporation, Tokyo (JP)

(72) Inventors: Ayako Muramatsu, Minami-ashigara (JP); Daisuke Kashiwagi, Minami-ashigara (JP); Shinichi Yoshinari, Minami-ashigara (JP); Kunihiro Atsumi, Minami-ashigara (JP); Ryoji Goto, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/678,821

(22) Filed: Nov. 8, 2019

(65) Prior Publication Data
US 2020/0075896 A1 Mar. 5, 2020

Related U.S. Application Data

(63) Continuation of application No. PCT/JP2018/018030, filed on May 10, 2018.

(30) Foreign Application Priority Data

May 11, 2017 (JP) .................................. 2017-094791

(51) Int. Cl.
*H01L 51/52* (2006.01)
*H01L 27/32* (2006.01)
(Continued)

(52) U.S. Cl.
CPC ...... *H01L 51/5281* (2013.01); *H01L 27/3244* (2013.01); *H01L 51/5275* (2013.01); *G02B 5/3016* (2013.01); *G02B 27/283* (2013.01)

(58) Field of Classification Search
CPC ......... H01L 51/50; H01L 51/52; H01L 51/56; H01L 51/5281; H01L 51/5275;
(Continued)

(56) References Cited

U.S. PATENT DOCUMENTS

2002/0093284 A1 7/2002 Adachi et al.
2005/0035353 A1 2/2005 Adachi et al.
(Continued)

FOREIGN PATENT DOCUMENTS

JP 2004-30955 A 1/2004
JP 2004-296162 A 10/2004
(Continued)

OTHER PUBLICATIONS

International Preliminary Report on Patentability and Written Opinion of the International Searching Authority (forms PCT/IB/373, PCT/ISA/237 and PCT/IB/326), dated Nov. 21, 2019, for corresponding International Application No. PCT/JP2018/018030, with a Written Opinion translation.

(Continued)

*Primary Examiner* — Chuong A Luu
(74) *Attorney, Agent, or Firm* — Birch, Stewart, Kolasch & Birch, LLP

(57) ABSTRACT

The present invention provides an organic EL image display device including a light emitting element substrate, and a circularly polarizing plate, in which the light emitting element substrate includes a reflecting layer and an organic electroluminescent layer on the reflecting layer, the reflecting layer, the organic electroluminescent layer, and the circularly polarizing plate are arranged in this order, a polarization separation layer is provided between the organic electroluminescent layer and the circularly polarizing plate, the polarization separation layer includes a polarization separation region that reflects light of one polarization state in light emitted from the organic electroluminescent layer, and transmits light of another polarization state, and a visible light transmission region, the polarization separation region is formed of a layer formed by immobilizing a cholesteric liquid crystalline phase, and a (Continued)

positive C region-containing layer is provided between the organic electroluminescent layer and the circularly polarizing plate. The organic EL image display device according to the present invention has high brightness and little light leakage and blurring at the time of oblique observation.

19 Claims, 3 Drawing Sheets

(51) Int. Cl.
*G02B 5/30* (2006.01)
*G02B 27/28* (2006.01)

(58) Field of Classification Search
CPC ............... H01L 51/5287; H01L 51/525; H01L 51/5271; H01L 51/0032; H01L 51/0095; H01L 51/5012; H01L 51/5044; H01L 27/32; H01L 27/3244; H01L 27/3251; H01L 27/3209; H01L 27/3225; H01L 27/3258; H01L 27/3216; H01L 27/3297; H01L 2227/323; H01L 2924/12044; H01L 2251/50; H01L 2251/568; H01L 2251/5384; H01L 2251/5338; G02B 5/3016; G02B 5/3025; G02B 5/3033; G02B 5/3041; G02B 27/286; G02B 27/288; G09F 9/00; G09F 9/30; G09F 9/302; G09F 9/3023; G09F 9/3026

USPC .......................................................... 257/40
See application file for complete search history.

(56) References Cited

U.S. PATENT DOCUMENTS

| | | | |
|---|---|---|---|
| 2014/0130955 A1* | 5/2014 | Yasui | B05D 5/10 156/60 |
| 2015/0277006 A1 | 10/2015 | Takasago et al. | |
| 2016/0190346 A1* | 6/2016 | Kawata | H01L 29/66969 257/43 |
| 2020/0227257 A1* | 7/2020 | Yamazaki | H01L 21/02483 |

FOREIGN PATENT DOCUMENTS

| | | |
|---|---|---|
| JP | 2005-63841 A | 3/2005 |
| JP | 4011292 B2 | 11/2007 |
| JP | 2009-283246 A | 12/2009 |
| JP | 2014-38713 A | 2/2014 |
| JP | 2016-53709 A | 4/2016 |

OTHER PUBLICATIONS

International Search Report (form PCT/ISA/210), dated Aug. 14, 2018, for corresponding International Application No. PCT/JP2018/018030, with an English translation.

Japanese Notice of Reasons for Refusal for corresponding Japanese Application No. 2019-517681, dated Aug. 4, 2020, with an English translation.

* cited by examiner

ORGANIC EL IMAGE DISPLAY DEVICE

CROSS-REFERENCE TO RELATED APPLICATIONS

This application is a continuation of PCT International Application No. PCT/JP2018/018030 filed on May 10, 2018, which claims priority under 35 U.S.C § 119 (a) to Japanese Patent Application No. 2017-094791 filed on May 11, 2017, the entire content of which is incorporated herein by reference.

BACKGROUND OF THE INVENTION

1. Field of the Invention

The present invention relates to an organic EL image display device.

2. Description of the Related Art

In an organic electroluminescent image display device (organic EL image display device, hereinafter, simply referred to as "image display device") that forms an image based on the light emitted from an organic electroluminescent layer, generally, a circularly polarizing plate constituted of a phase difference layer and a polarization layer is arranged in order to reduce the reflected glare of external light and to improve the contrast. However, in this configuration, a half or more of the light emitted from the organic electroluminescent layer is absorbed by the circularly polarizing plate.

In consideration of the above problem, JP4011292B proposes to provide polarization separation means between an organic electroluminescent layer and a circularly polarizing plate. The polarization separation means transmits the light passing through the circularly polarizing plate, reflects the polarized light absorbed by the circularly polarizing plate, and enhances the light utilization efficiency based on specular reflection at a reflecting layer in a light emitting element substrate so as to improve the brightness. Further, JP4011292B specifically discloses the polarization separation means obtained by forming a cholesteric liquid crystal layer having wavelength selective reflectivity corresponding to the light emission wavelength of the corresponding organic electroluminescent layer in each region divided by a black matrix corresponding to the arrangement of the organic electroluminescent layers.

In JP2005-063841A, in the above configuration, a problem that some of light is not absorbed by the polarizing plate, is transmitted, and leaks to the outside because the polarization state of external light is changed based on an unnecessary phase difference that occurs in the cholesteric liquid crystal layer with an increase in viewing angle is pointed out. In JP2005-063841A, in order to solve the above problem, a configuration further including a phase compensation layer that functions as a refractive index ellipsoid having almost no refractive index difference in an in-plane direction and having a refractive index in a thickness direction different from a refractive index in the in-plane direction is proposed.

SUMMARY OF THE INVENTION

In the organic EL image display devices disclosed in JP4011292B and JP2005-063841A, a black matrix for providing a section corresponding to the organic electroluminescent layer is provided between the organic electroluminescent layer and the circularly polarizing plate. Since the amount of light transmitted from the organic electroluminescent layer to the circularly polarizing plate side is reduced by the visible light blocking black matrix, the brightness of the organic EL image display device is reduced. On the other hand, in a case where a cholesteric liquid crystal layer is arranged without providing a visible light blocking layer, there is a problem that blurring is observed in an image.

The present invention is made to solve the above problems and an object thereof is to provide an organic EL image display device in which brightness is high and light leakage and blurring at the time of oblique observation due to external light reflection is reduced.

The present inventors have considered that the light leakage at the time of oblique observation is caused by the optical properties of a cholesteric liquid crystal layer, and have further investigated to complete the present invention.

That is, the present invention provides the following [1] to [17].

[1] An organic EL image display device comprising: a light emitting element substrate; and a circularly polarizing plate, in which the light emitting element substrate includes a reflecting layer and an organic electroluminescent layer on the reflecting layer, the reflecting layer, the organic electroluminescent layer, and the circularly polarizing plate are arranged in this order, a polarization separation layer is provided between the organic electroluminescent layer and the circularly polarizing plate, the polarization separation layer includes a polarization separation region that reflects light of one polarization state in light emitted from the organic electroluminescent layer, and transmits light of another polarization state, and a visible light transmission region, the polarization separation region includes a layer formed by immobilizing a cholesteric liquid crystalline phase, and a positive C region-containing layer is provided between the organic electroluminescent layer and the circularly polarizing plate.

[2] The organic EL image display device according to [1], in which a retardation Rth(550) of a positive C region of the positive C region-containing layer in a film thickness direction at a wavelength of 550 nm is −250 nm to −70 nm.

[3] The organic EL image display device according to [1], in which a retardation Rth(550) of a positive C region of the positive C region-containing layer in a film thickness direction at a wavelength of 550 nm is −230 nm to −130 nm.

[4] The organic EL image display device according to any one of [1] to [3], in which the circularly polarizing plate includes a ¼ wavelength plate, a ½ wavelength phase difference plate, and a polarization layer in this order.

[5] The organic EL image display device according to any one of [1] to [3], in which the circularly polarizing plate includes a reverse wavelength dispersion A-plate and a polarization layer.

[6] The organic EL image display device according to any one of [1] to [5], in which the organic electroluminescent layer, the positive C region-containing layer, the polarization separation layer, and the circularly polarizing plate are arranged in this order.

[7] The organic EL image display device according to any one of [1] to [6], in which the visible light transmission region is prepared using a composition the same as a composition for preparing the polarization separation region.

[8] The organic EL image display device according to any one of [1] to [7], in which the visible light transmission region includes an optically isotropic region.

[9] The organic EL image display device according to [8], in which the positive C region-containing layer includes a positive C region, and an absolute value of a retardation Rth(X) of a visible light region of the positive C region at an arbitrary wavelength X nm in a film thickness direction is an arbitrary value between an absolute value of a retardation Rth-Ch(X) of the polarization separation region at the wavelength X nm in a film thickness direction and an absolute value of a retardation Rth-T(X) of the visible light transmission region at the wavelength of X nm.

[10] The organic EL image display device according to [7], in which the visible light transmission region is a layer formed by immobilizing a cholesteric liquid crystalline phase and has a center wavelength of selective reflection in an ultraviolet light wavelength range or an infrared light wavelength range.

[11] The organic EL image display device according to [10], in which the positive C region-containing layer includes a positive C region, and an absolute value of a retardation Rth(X) of a visible light region of the positive C region at an arbitrary wavelength X nm in a film thickness direction is equal to an absolute value of a retardation Rth(X) of the polarization separation region at the wavelength X nm in a film thickness direction.

[12] The organic EL image display device according to [8], in which the positive C region-containing layer further includes, in addition to a positive C region, an optically isotropic region.

[13] The organic EL image display device according to [12], in which an absolute value of a retardation Rth(X) of a visible light region of the positive C region at an arbitrary wavelength X nm in a film thickness direction is equal to an absolute value of a retardation Rth(X) of the polarization separation region at the wavelength X nm in a film thickness direction.

[14] The organic EL image display device according to any one of [1] to [13], in which the light emitting element substrate includes an organic electroluminescent layer group in which the organic electroluminescent layers are arranged in a matrix form on the reflecting layer.

[15] The organic EL image display device according to [14], in which the polarization separation region is a set of polarization separation sites arranged in a matrix form corresponding to the organic electroluminescent layer group.

[16] The organic EL image display device according to [15], in which the organic electroluminescent layer group includes an organic electroluminescent layer that emits light of two or more wavelengths, and the polarization separation site reflects light of one polarization state in a wavelength range in which the organic electroluminescent layer arranged at the corresponding position emits light.

[17] The organic EL image display device according to [15] or [16], in which the visible light transmission region includes an optically isotropic region, the positive C region-containing layer includes the positive C region and an optically isotropic region, and the positive C region is formed in a matrix form corresponding to the polarization separation sites arranged in the matrix form.

According to the present invention, it is possible to provide an organic EL image display device having high brightness and little light leakage and blurring at the time of oblique observation.

DESCRIPTION OF THE PREFERRED EMBODIMENTS

Figure 1A:
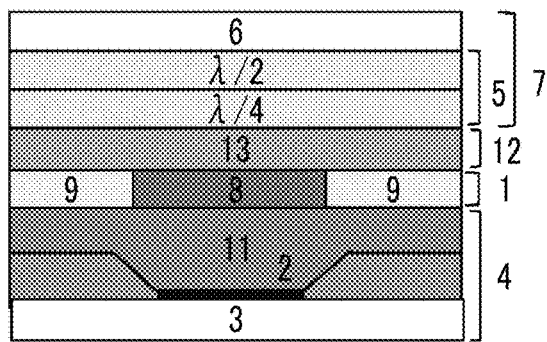
FIGS. 1A to 1E are views showing schematic cross sections of examples of an image display device according to the present invention.

Hereinafter, the present invention will be described in detail.

In the present specification, a numerical range denoted by using "to" indicates a range including numerical values before and after "to" as the lower limit and the upper limit.

In the present specification, numerical values, numerical ranges, and qualitative expressions (for example, expressions such as "equivalent", "the same" and "equal" are interpreted to be numerical values, numerical ranges, and properties including error which is generally allowable in an image display device and the members used therein.

In the present specification, for example, an angle expressed as "45°", "parallel", "perpendicular" or "orthogonal" means that an error with respect to the exact angle is in a range of less than 5° unless otherwise specified. The error with respect to the exact angle is preferably less than 4° and more preferably less than 3°. In the present specification, the term "(meth)acrylate" is used as a meaning of "any one or both of acrylate and methacrylate.

In the present specification, the term "sense" used in regard to circularly polarized light means right-handed circularly polarized light or left-handed circularly polarized light. The sense of circularly polarized light is defined such that, in a case where light is viewed as the light proceeds toward an observer and in a case where the tip of the electric field vector rotates clockwise with the increase in time, the sense is right-handed circularly polarized light, and in a case where the tip of the electric field vector rotates counter-clockwise, the light is left-handed circularly polarized light.

In the present specification, the term "sense" may be used in regard to a twisted direction of the helix of a cholesteric liquid crystal. In a case where the twisted direction (sense) of the helix of the cholesteric liquid crystal is right, right-handed circularly polarized light is reflected and in a case where left-handed circularly polarized light is transmitted and the sense is left-handed, left-handed circularly polarized light is reflected and right-handed circularly polarized light is transmitted.

Visible light is light having wavelengths visually recognizable by human eyes among electromagnetic waves and indicates light in a wavelength range of 380 nm to 780 nm.

In the present specification, the visible light transmittance may be measured according to JIS A 5759: 2008. The measurement of the visible light transmittance can be performed by using, for example, an ultraviolet-visible near-infrared spectrometer (V-670, manufactured by JASCO Corporation, using integrating sphere unit ISN-723).

In addition, in the present specification, the visible light reflectivity means a numerical value calculated based on a calculation method described in JIS A5759. That is, the light reflectivity is obtained by measuring the reflectivity at a wavelength of 380 nm to 780 nm is measured with a spectrophotometer, and multiplying the measured reflectivity by a weighting factor to obtain a weighted average, the weighting factor being obtained based on a spectral distribution of daylight D65 defined by The International Commission on Illumination (CIE), and a wavelength distribution and a wavelength interval of spectral luminous efficiency function for photopic vision defined by CIE.

In a case where the visible light reflectivity is obtained, for example, a spectrophotometer "V-670" manufactured by JASCO Corporation can be used.

In the present specification, the term "slow axis" means a direction in which the refractive index becomes maximum in the plane.

In the present specification, $Re(\lambda)$ and $Rth(\lambda)$ respectively represent an in-plane retardation and a retardation in the thickness direction at a wavelength $\lambda$. In the present specification, $Re(\lambda)$ and $Rth(\lambda)$ are values measured at a wavelength $\lambda$ using AxoScan OPMF-1 manufactured by Opto Science, Inc. Specifically, in a case in which the average refractive index $((Nx+Ny+Nz)/3)$ and the film thickness $(d(\mu m))$ are input to AxoScan, it is possible to calculate Slow axis direction (°)

$$Re(\lambda)=R0(\lambda)$$

$$Rth(\lambda)=((nx+ny)/2-nz) \times d.$$

$R0(\lambda)$ is expressed as a numerical value calculated by AxoScan OPMF-1 and means $Re(\lambda)$.

<Organic EL Image Display Device>

An image display device according to an embodiment of the present invention is an organic EL image display device that performs image display based on light emitted from an organic electroluminescent layer. An organic EL image display device is a self-emitting display device, and has such advantages in display performances as higher visibility and less viewing angle dependency as compared with a cathode ray tube (CRT) type display device or liquid crystal display device. Further, an organic EL image display device has advantages in reducing the weight or thickness of the display.

The organic EL image display device displays an image by a light emitting element substrate provided with an organic electroluminescent layer. The organic EL image display device generally includes a circularly polarizing plate on an image display side of the organic electroluminescent layer in order to reduce reflected glare of external light and improve contrast.

The image display device according to the embodiment of the present invention includes a polarization separation layer between the organic electroluminescent layer and the circularly polarizing plate. In the image display device according to the embodiment of the present invention, a reflecting layer, the organic electroluminescent layer, the polarization separation layer, and the circularly polarizing plate are arranged in this order. In the organic EL image display device, it is preferable that a plurality of organic electroluminescent layers form an organic electroluminescent layer group and are arranged on the reflecting layer in a matrix form.

The image display device according to the embodiment of the present invention further includes a positive C region-containing layer between the organic electroluminescent layer and the circularly polarizing plate. In the image display device according to the embodiment of the present invention, the reflecting layer, the organic electroluminescent layer, the positive C region-containing layer, and the circularly polarizing plate are arranged in this order.

The order of the polarization separation layer and the positive C region-containing layer is not particularly limited. The organic electroluminescent layer, the positive C region-containing layer, the polarization separation layer, and the circularly polarizing plate may be arranged in this order, and the organic electroluminescent layer, the polarization separation layer, the positive C region-containing layer, and the circularly polarizing plate may be arranged in this order.

Schematic cross-sectional views of examples of the image display device according to the embodiment of the present invention are shown in FIGS. 1A to 1E. In the drawing, in a case where an adhesive layer is provided between layers, the adhesive layer is omitted.

Figure 1B:
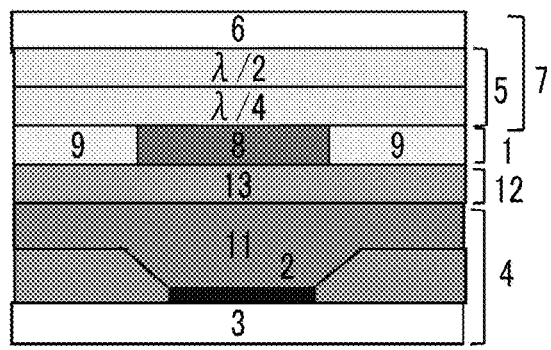
Figure 1C:
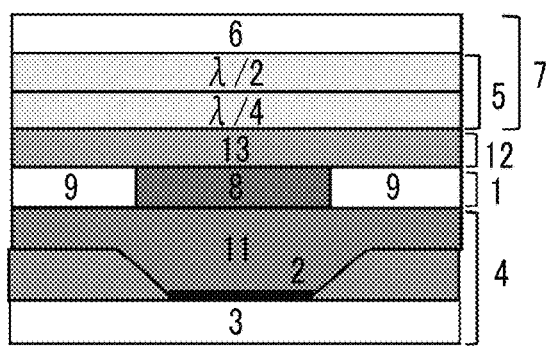
Figure 1D:
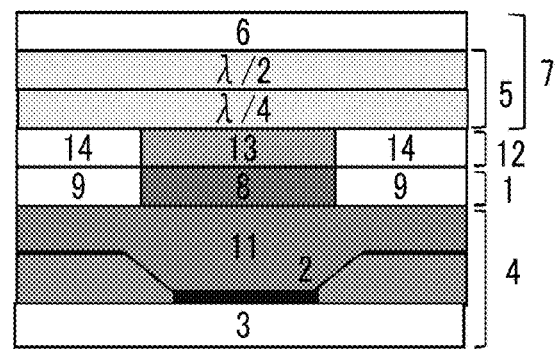
Figure 1E:
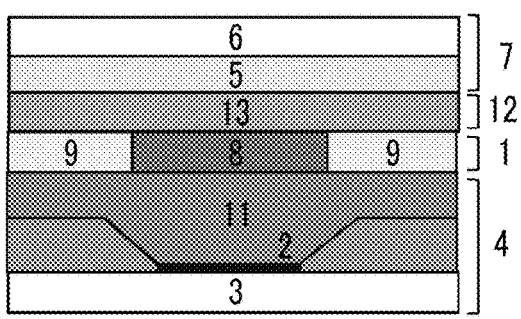

In all the configurations shown in FIGS. 1A to 1E, the polarization separation layer has a polarization separation site 8 and an optically isotropic visible light transmission region 9. In the configurations shown in FIGS. 1A, and 1C to 1E, a reflecting layer 3, an organic electroluminescent layer 2, a polarization separation layer 1, a positive C region-containing layer 12, and a circularly polarizing plate 7 are provided in this order. FIG. 1B shows a configuration in which a reflecting layer 3, an organic electroluminescent layer 2, a positive C region-containing layer 12, a polarization separation layer 1, and a circularly polarizing plate 7 are provided in this order. In the configuration shown in FIG. 1D, the positive C region-containing layer 12 includes a positive C region 13 and an optically isotropic region. In all the configurations shown in FIGS. 1A to 1D, a phase difference layer 5 has a two-layer structure of a $\lambda/2$ plate and a $\lambda/4$ plate, but in the configuration shown in FIG. 1E, as a phase difference layer 5, a $\lambda/4$ plate of a single layer structure (for example, a reverse wavelength dispersion A-plate) is used.

[Polarization Separation Layer, Polarization Separation Site, and Polarization Separation Region]

In the polarization separation layer in the image display device according to the embodiment of the present invention, it is preferable that a plurality of polarization separation sites corresponding to a plurality of the organic electroluminescent layers are included. In the present specification, the "correspond" means that when the image display device is viewed from the image display side, the organic electroluminescent layer and the polarization separation site are at the same position or in a position where the organic electroluminescent layer and the polarization separation site are at least partially overlapped with each other. In the corresponding organic electroluminescent layer and polarization separation site, the light emitted from the organic electroluminescent layer (preferably 50% or more, more preferably 60% or more, and even more preferably 70% or more) may be reflected or transmitted through the polarization separation site.

When the image display device is viewed from the image display side, the corresponding organic electroluminescent layer and polarization separation site may have the same size, the size of the organic electroluminescent layer may be large, or the size of the polarization separation site may be large. Among these, it is preferable that the size of the polarization separation site is large. It is preferable that the size of the image display device according to the embodiment of the present invention is such that the organic electroluminescent layer is covered by the corresponding polarization separation site when viewed from the image display side.

When the image display device according to the embodiment of the present invention is viewed from the image display side, it is preferable that the polarization separation site is arranged in the matrix form in the polarization separation layer. In the present specification, a region in which the plurality of polarization separation sites are formed is referred to as a polarization separation region.

In the present specification, polarization separation site refers to a site for performing polarization separation in the wavelength range of the light emitted from the corresponding organic electroluminescent layer. The polarization separation refers to the reflection of light in one polarization state and the transmission of light in another polarization state. In the image display device according to the embodiment of the present invention, the polarization separation may be performed by reflecting circularly polarized light of one sense and transmitting circularly polarized light of the other sense.

The polarization separation site may be a site where selective polarization separation can be performed in a wavelength range of light of the corresponding organic electroluminescent layer or a site where polarization separation can be performed in a wavelength range other than the wavelength range.

The term "selective polarization separation" refers to polarization separation only in the wavelength range corresponding to the wavelength range of the light emitted from the organic electroluminescent layer corresponding to the polarization separation site in the visible light region. Accordingly, the polarization separation site may be a site where polarization separation is performed only in the wavelength range corresponding to the wavelength range of the light emitted from the organic electroluminescent layer corresponding to the polarization separation site in the visible light region, may be a site where polarization separation is performed in the substantially entire wavelength range of visible light, or may be a site where polarization separation is performed in a plurality of wavelength ranges such as a red wavelength range, a green wavelength range, and a blue wavelength range.

It is preferable that the polarization separation site is a site capable of selectively performing polarization separation in the wavelength range of the light emitted from the corresponding organic electroluminescent layer.

In the image display device according to the embodiment of the present invention, the polarization separation site is arranged such that in the light emitted from the organic electroluminescent layer, the polarized light which is not transmitted through the circularly polarizing plate is reflected at the polarization separation site and is directed toward the reflecting layer.

In the image display device according to the embodiment of the present invention, the polarization separation layer further includes a visible light transmission region. It is also preferable that the polarization separation layer is divided into visible light transmission regions to form polarization separation sites. It is possible to improve the brightness by increasing the amount of light reaching the image display side from the organic electroluminescent layer by dividing the polarization separation site using the visible light transmission region instead of using a visible light shielding layer or the like. It is also possible to reduce the blurring of an image derived from the light traveling obliquely in the direction of the circularly polarizing plate from the inside of the organic electroluminescent layer by separating the polarization separation layer by the visible light transmission region without continuously providing the polarization separation site. It is considered that an image is blurred as a result of the multiple reflection of a depolarized component in a process that the light directed toward the circularly polarizing plate from the inside of the organic electroluminescent layer is reflected at the polarization separation site and the reflected light is reflected at the reflecting layer and emitted to the image display side. Since the light directed obliquely toward the direction of the circularly polarizing plate from the inside of the organic electroluminescent layer is transmitted as it is and is emitted to the image display side by dividing the polarization separation layer using the visible light transmission region, it is possible to reduce blurring (such as color blurring when observed in the oblique direction during white display of the image display device).

The visible light transmittance in the visible light transmission region may be 80% to 100% and is preferably 90% to 100%. It is preferable that the visible light transmission region is non-light-reflective at least at the surface on the organic electroluminescent layer side. Particularly, it is preferable that the organic electroluminescent layer group is non-light-reflective in each light emission wavelength range. It is also preferable that the organic electroluminescent layer group is non-light-reflective throughout the entire visible light wavelength range. It is preferable that the visible light reflectivity of the surface of the visible light transmission region on the organic electroluminescent layer side is 0% to 5%, and preferably 0% to 2%.

The visible light transmission region may be, for example, an optically isotropic region, an ultraviolet light wavelength range, or a region having a center wavelength of selective reflection in an infrared light wavelength range. All of these regions can be prepared using the same composition as the composition for preparing the polarization separation site, for example, as described below. The visible light transmission region is a region after removal of a coating film or a cured film formed in the preparation of the above-mentioned polarization separation site and may be a region which is an adhesive for bonding with the light emitting element substrate.

In the image display device according to the embodiment of the present invention, it is preferable that Formula (1) is satisfied in an arbitrary plane Z that passes through the polarization separation site at arbitrary coordinates xy of the matrix of the polarization separation layer and is perpendicular to the reflecting layer. By forming the polarization separation site by providing a section in the visible light transmission region so as to satisfy Formula (1), it is possible to efficiently reduce the blurring caused by multiple reflection and depolarization as described above.

$$L \leq (M+N)/2 \tag{1}$$

Figure 2:
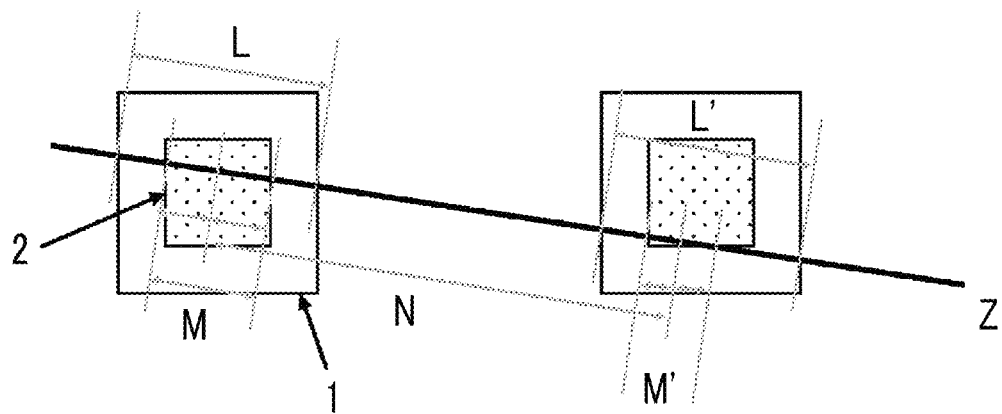
FIG. 2 is a view showing L, M, and N in Formulae (1) and (2) in a top view as viewing a polarization separation layer from an image display side in a normal direction.

L: length of intersection between the polarization separation site of the coordinates xy and the plane Z M: length of intersection between the organic electroluminescent layer of the coordinates xy corresponding to the polarization separation site of the coordinates xy and the plane Z N: distance between the center of intersection between of the organic electroluminescent layer of the coordinates xy and the plane Z and the center of intersection between the nearest organic electroluminescent layer which is an organic electroluminescent layer that emits light of the same wavelength as the organic electroluminescent layer of the coordinate xy and has an intersection point in the plane Z and the plane Z L, M, and N may be determined in a plan view of the image display device according to the embodiment of the present invention as viewing the polarization separation layer from the image display side in the normal direction of the light emitting element substrate, and can be defined as shown in FIG. 2, for example.

In the image display device according to the embodiment of the present invention, in addition, in the polarization separation site of the arbitrary coordinates xy of the polarization separation layer, it is preferable to satisfy Formula (2). By forming the polarization separation site by providing a section in the visible light transmission region so as to satisfy Formula (2), the polarization separation site has a size that matches the distance between the polarization separation site and the organic electroluminescent layer, and thus it is possible to improve brightness by increasing light utilization efficiency.

$$L \geq 1.25 \times D + M \quad (2)$$

D: distance between the polarization separation site of the coordinates xy and the organic electroluminescent layer of the coordinates xy In the image display device according to the embodiment of the present invention, it is preferable that the wavelength range of the reflection (the reflection in the wavelength range of light emitted from the corresponding organic electroluminescent layer) at the polarization separation site is wider than the wavelength range of the light emitted from the organic electroluminescent layer. In the image display devices including organic electroluminescent layers with different light emission wavelengths for the organic electroluminescent layer group, the half-width of the light emission spectrum of each organic electroluminescent layer may be different, but the above relationship may be satisfied in the corresponding organic electroluminescent layer and the polarization separation site.

In an organic EL image display device in which the reflection wavelength range of a polarization separation site is wider than the light emission wavelength range of an organic electroluminescent layer, the brightness is improved not only in the front but also in the oblique direction. As will be described later, for light incident from the oblique direction, the reflection wavelength of the polarization separation site including the cholesteric liquid crystal layer is shifted to a short wavelength side. Therefore, even in the polarization separation site that reflects light incident in the normal direction from the organic electroluminescent layer, the light from the oblique direction may not be reflected. Due to the effect of improving brightness in the oblique direction, it is considered that light that was not able to be reflected is reflected by widening the reflection wavelength range of the polarization separation site.

The wavelength range of the reflection at the polarization separation site means the half-width (full half-width) of the transmission spectrum of the polarization separation site. In addition, the wavelength range of the light emitted from the organic electroluminescent layer means the half-width of the light emission spectrum of the organic electroluminescent layer.

The half-width of the light emission spectrum of a known organic electroluminescent layer is usually 40 to 55 nm, and the half-width of the transmission spectrum of the polarization separation site may be appropriately set to a broader range than the above half-width range. Typically, the half-width is preferably 70 to 130 nm, more preferably 80 to 120 nm, and most preferably 90 to 110 nm. The above effect can be obtained by setting the reflection range to 70 nm or more, and an increase in the reflectivity from an image plane at the time of the extinction derived from the polarization separation site can be suppressed by setting the reflection range to 130 nm or less.

The plurality of polarization separation sites in the polarization separation layer may be arranged in the matrix form corresponding to the organic electroluminescent layer group. The polarization separation layer may be formed of a plurality of, preferably three, polarization separation sites that reflect light in one polarization state and transmits light in another polarization state at different wavelengths. The reflection wavelengths of the plurality of polarization separation sites correspond to the light emission wavelengths of the organic electroluminescent layers included in the organic electroluminescent layer group.

Each of the polarization separation site and the polarization separation layer may be a single layer or may be formed of a plurality of layers. It is preferable that the polarization separation site and the polarization separation layer include a cholesteric liquid crystal layer. The polarization separation site and the polarization separation layer may include an alignment layer, a protective layer (additive layer), and the like in addition to the cholesteric liquid crystal layer. The polarization separation site and the polarization separation layer may include an optically isotropic layer formed by curing a composition used for forming the cholesteric liquid crystal layer in a state in which the liquid crystal compound is not aligned.

The polarization separation site is not particularly limited as long as the above properties that the organic electroluminescent layer reflects light of one polarization state and transmits the light of another polarization state in the light emitted from the organic electroluminescent layer are attained, but is preferably a site including a cholesteric liquid crystal layer. The polarization separation site including a cholesteric liquid crystal layer may be formed of only the cholesteric liquid crystal layer and may include other layers such as an alignment layer and a protective layer (additive layer).

(Cholesteric Liquid Crystal Layer)

In the present specification, the cholesteric liquid crystal layer means a layer in which a cholesteric liquid crystalline phase is immobilized.

It is known that the cholesteric liquid crystalline phase selectively reflects circularly polarized light of one sense of right-handed circularly polarized light or left-handed circularly polarized light in a specific wavelength range and exhibits circular polarization selective reflection that the cholesteric liquid crystalline phase transmits circularly polarized light of the other sense. In the present specification, the circular polarization selective reflection is sometimes referred to as selective reflection.

As a film including a layer formed by immobilizing a cholesteric liquid crystalline phase exhibiting circular polarization selective reflectivity, a number of films formed of a composition including a polymerizable liquid crystal compound have been known in the related art and regarding the cholesteric liquid crystal layer, the related arts thereof can be referred to.

The cholesteric liquid crystal layer may be a layer in which alignment of a liquid crystal compound formed of a cholesteric liquid crystalline phase is retained, and typically may be a layer in which the polymerizable liquid crystal compound is set to be in an alignment state of the cholesteric liquid crystalline phase and then is subjected to ultraviolet ray irradiation, heating, or the like for polymerization and curing, and thus, a layer which does not have fluidity is formed and is simultaneously changed to a state in which a change does not occur in an alignment mode due to an external field or an external force. Further, in the cholesteric liquid crystal layer, it is sufficient that the optical properties of the cholesteric liquid crystalline phase are retained in the layer, and the liquid crystal compound in the layer may no longer exhibit liquid crystal properties. For example, the polymerizable liquid crystal compound may have a high molecular weight by a curing reaction, and may no longer have liquid crystal properties.

A center wavelength $\lambda$ of the selective reflection of the cholesteric liquid crystal layer depends on a pitch length P (=a helical cycle) of the helical structure in a cholesteric liquid crystalline phase, and follows a relationship of $\lambda = n \times P$ with an average refractive index n of the cholesteric liquid crystal layer. In the present specification, the center wavelength $\lambda$ of the selective reflection of the cholesteric liquid crystal layer means a wavelength in a center position of a reflection peak of a circular polarization reflection spectrum measured from the normal direction of the cholesteric liquid crystal layer. In addition, in the present specification, the center wavelength of the selective reflection means the center wavelength of the cholesteric liquid crystal layer when measured from the normal direction of the cholesteric liquid crystal layer.

The center wavelength of the selective reflection and the half-width of the cholesteric liquid crystal layer can be obtained as follows. In a case where the transmission spectrum of the cholesteric liquid crystal layer (measured from the normal direction of the cholesteric liquid crystal layer) is measured using a spectrophotometer UV 3150 (manufactured by Shimadzu Corporation), a drop peak of the transmittance peak is observed in the selective reflection range. Out of two wavelengths of the intermediate (average) transmittances between the minimum transmittance of the peak and the transmittance before a drop, in a case where a wavelength value on a short wavelength side is $\lambda_l$ (nm) and a wavelength value on a long wavelength side is $X_h$ (nm), the center wavelength $\lambda$ and the half-width $\Delta\lambda$ of the selective reflection can be expressed by the following equation.

$$\lambda = (\lambda_l + \lambda_h)/2$$

$$\Delta\lambda = (\lambda_h - \lambda_l)$$

The center wavelength of the selective reflection obtained as described above substantially coincides with the wavelength at the center position of the reflection peak of the circular polarization reflection spectrum of the cholesteric liquid crystal layer measured from the normal direction.

As seen from the equation $\lambda = n \times P$, it is possible to adjust the center wavelength of the selective reflection by adjusting the pitch length of the helical structure. The center wavelength $\lambda$ can be adjusted by adjusting the n value and the P value so as to selectively reflect any one of the right-handed circularly polarized light and the left-handed circularly polarized light at the wavelength of the selective reflection required to reflect the light incident from the corresponding organic electroluminescent layer (for example, light incident in the normal direction) in the cholesteric liquid crystal layer used for the polarization separation site.

That is, in the image display device according to the embodiment of the present invention, the peak (maximum value) of the light emission spectrum of the organic electroluminescent layer to be used may be adjusted so as to substantially coincide with the center wavelength of the selective reflection of the cholesteric liquid crystal layer of the corresponding polarization separation site. By combining the center wavelength of the selective reflection and the wavelength of the light emission peak of the organic electroluminescent layer for image display of the image display device, in the light emitted from the organic electroluminescent layer, the light of one polarization state can be reflected and the light of another polarization state can be transmitted.

For the light obliquely incident on the cholesteric liquid crystal layer, the center wavelength of the selective reflection is shifted to the short wavelength side. In a case where the center wavelength of the selective reflection when a light beam with respect to the normal direction of the cholesteric liquid crystal layer (the helical axis direction of the cholesteric liquid crystal layer) is transmitted through the cholesteric liquid crystal layer having a refractive index $n_2$ at an angle $\theta_2$ is $\lambda_d$, $\lambda_d$ is expressed by the following equation.

$$\lambda_d = n_2 \times P \times \cos \theta_2$$

The average refractive index n of the cholesteric liquid crystal layer can be adjusted by, for example, the kind of polymerizable liquid crystal compound.

Since the pitch (P value) of the cholesteric liquid crystalline phase depends on the kind of chiral agent used in combination with a polymerizable liquid crystal compound or the addition concentration thereof, the desired pitch can be obtained by adjusting the kind of chiral agent and the addition concentration thereof. Further, methods disclosed in "Introduction to Liquid Crystal Chemical Test", Page 46, edited by Japan Liquid Crystal Society, published by Sigma Publications, 2007, and "Liquid Crystal Handbook", Page 196, Liquid Crystal Handbook Editing Committee Maruzen are able to be used as a measurement method of the sense or the pitch of the helix.

In the image display device according to the embodiment of the present invention, as the polarization separation site, a cholesteric liquid crystal layer having a selective reflection center wavelength corresponding to the light emission wavelength of each organic electroluminescent layer in the organic electroluminescent layer group may be used. For example, when the organic electroluminescent layer group includes an organic electroluminescent layer for red light emission, an organic electroluminescent layer for green light emission, and an organic electroluminescent layer for blue light emission, the organic electroluminescent layer group may include a cholesteric liquid crystal layer having a center wavelength of selective reflection in a red light wavelength range (for example, 580 nm to 700 nm), a cholesteric liquid crystal layer having a center wavelength of selective reflection in a green light wavelength range (for example, 500 nm to 580 nm), and a cholesteric liquid crystal layer having a center wavelength of selective reflection in a blue light wavelength range (for example, 400 nm to 500 nm) in the arrangement corresponding to each layer.

In addition, in the image display device according to the embodiment of the present invention, as the visible light transmission region of the polarization separation layer, a cholesteric liquid crystal layer having a center wavelength of selective reflection in an ultraviolet light wavelength range (for example, 10 to 380 nm) or a cholesteric liquid crystal layer having a center wavelength of selective reflection in an infrared light wavelength range (for example, 780 nm to 2500 nm) may be used.

As each cholesteric liquid crystal layer, a cholesteric liquid crystal layer in which the sense of the helix is right-handed or left-handed corresponding to the sense of the circularly polarized light transmitted through the circularly polarizing plate of the image display device according to the embodiment of the present invention is used. Specifically, a cholesteric liquid crystalline phase circularly which transmits circularly polarized light of the same sense as the sense of the circularly polarized light transmitted through the circularly polarizing plate is used.

The sense of the reflection circular polarization of the cholesteric liquid crystal layer coincides with the sense of the helix. When the polarization separation layer includes a plurality of cholesteric liquid crystal layers, the senses of the helices of these layers are usually the same.

As described above, the wavelength range of the reflection of the polarization separation site is wider than the light emission wavelength range of the corresponding organic electroluminescent layer. This may be achieved by the fact that the half-width of the selective reflection of the cholesteric liquid crystal layer included in the polarization separation site is wider than the half-width of the light emission spectrum of the organic electroluminescent layer.

The half-width $\Delta\lambda$ (nm) of the selective reflection of the cholesteric liquid crystal layer depends on the birefringence $\Delta n$ of the liquid crystal compound and the pitch P and follows a relationship of $\Delta\lambda = \Delta n \times P$. Therefore, the half-width of the selective reflection can be controlled by adjusting $\Delta n$. The adjustment of $\Delta n$ can be performed by adjusting the kind of polymerizable liquid crystal compound, the mixing ratio thereof, or by controlling the temperature during alignment immobilization. In order to form a polarization separation site that exhibits reflection in a wavelength range that is wider than the light emission wavelength range of the corresponding organic electroluminescent layer, in the image display device according to the embodiment of the present invention, it is also preferable to use a combination of a polymerizable liquid crystal compound or a polymerizable liquid crystal compound described later.

In order to form one kind of cholesteric liquid crystal layer having the same center wavelength of selective reflection, it is also possible to laminate a plurality of cholesteric liquid crystal layers having the same cycle P and the same helical sense. By laminating the cholesteric liquid crystal layers having the same cycle P and the same sense of the helix, it is possible to increase circular polarization selectivity at a specific wavelength.

(Method of Preparing Cholesteric Liquid Crystal Layer)

Hereinafter, a method of preparing a cholesteric liquid crystal layer will be described.

For forming the cholesteric liquid crystal layer, a liquid crystal composition including a polymerizable liquid crystal compound is used. The liquid crystal composition may further include a chiral agent (optically active compound). The liquid crystal composition dissolved in a solvent or the like by further mixing with a surfactant or a polymerization initiator, if necessary, is applied to a support, an alignment film, a cholesteric liquid crystal layer which becomes an underlayer, and the like, after alignment and aging, the liquid crystal composition is cured to immobilize the liquid crystal compound, and thus, the cholesteric liquid crystal layer can be formed.

(Polymerizable Liquid Crystal Compound)

The polymerizable liquid crystal compound may be a rod-like liquid crystal compound or a disk-like liquid crystal compound, and it is preferable that the polymerizable liquid crystal compound is a rod-like liquid crystal compound.

Examples of a rod-like polymerizable liquid crystal compound include a rod-like nematic liquid crystal compound. As the rod-like nematic liquid crystal compound, azomethines, azoxys, cyanobiphenyls, cyanophenyl esters, benzoic acid esters, cyclohexane carboxylic acid phenyl esters, cyanophenyl cyclohexanes, cyano-substituted phenyl pyrimidines, alkoxy-substituted phenyl pyrimidines, phenyl dioxanes, trans, and alkenyl cyclohexyl benzonitriles are preferably used. Not only a low molecular liquid crystal compound but also a high molecular liquid crystal compound can be used for the rod-like liquid crystal compound.

The polymerizable liquid crystal compound can be obtained by introducing a polymerizable group into a liquid crystal compound. Examples of the polymerizable group include an unsaturated polymerizable group, an epoxy group, an oxetanyl group, and an aziridinyl group, an unsaturated polymerizable group is preferable, and an ethylenically unsaturated polymerizable group is particularly preferable. The polymerizable group can be introduced into the molecules of the liquid crystal compound by various methods. The number of polymerizable groups of the polymerizable liquid crystal compound is preferably 1 to 6 and is more preferably 1 to 3. Examples of the polymerizable liquid crystal compound include compounds described in Makromol. Chem., Vol. 190, Page 2255 (1989), Advanced Materials Vol. 5, Page 107 (1993), U.S. Pat. Nos. 4,683,327A, 5,622,648A, 5,770,107A, WO95/022586A, WO95/024455A, WO97/000600A, WO98/023580A, WO98/052905A, JP1989-272551A (JP-H01-272551A), JP1994-016616A (JP-H06-016616A), JP1995-110469A (JP-H07-110469A), JP1999-080081A (JP-H11-080081A), JP2001-328973A, JP2009-069793A, JP2010-113249A, JP2011-203636A, and the like.

In addition, as polymerizable liquid crystal compounds other than the above compounds, cyclic organopolysiloxane compounds having a cholesteric liquid crystalline phase as disclosed in JP1982-165480A (JP-S57-165480A) can be used. Further, as the polymer liquid crystal compound, for example, a polymer in which a liquid crystal mesogenic group is introduced into a main chain, a side chain, or both a main chain and a side chain, a polymer cholesteric liquid crystal in which a cholesteryl group is introduced into a side chain, a liquid crystal polymer described in JP1997-133810A (JP-H09-133810A), and a liquid crystal polymer described in JP1999-293252A (JP-H11-293252A) can be used.

As the polymerizable liquid crystal compound, it is preferable to use a liquid crystal compound having two or more reactive groups having different polymerization conditions in the same molecule. Examples of combinations of reactive groups having different polymerization conditions include combinations of radically photopolymerizable reactive groups and cationically photopolymerizable reactive groups.

As described above, in order to set the wavelength range of the reflection of the polarization separation site to be wider than the wavelength range of the light emitted from the organic electroluminescent layer, it is preferable to use a liquid crystal compound exhibiting a high refractive index anisotropy Δn. As seen from the equation (Δλ=Δn×P), it is possible to obtain a wide half-width Δλ by using a liquid crystal compound exhibiting high refractive index anisotropy Δn. Specifically, the Δn of the liquid crystal compound at 30° C. is preferably 0.25 or more, more preferably 0.3 or more, and even more preferably 0.35 or more. The upper limit is not particularly limited, but is often 0.6 or less.

As the measurement method of the refractive index anisotropy Δn, a method using a wedge-like liquid crystal cell described in Liquid Crystal Handbook (edited by Liquid crystal handbook editing committee, published by Maruzen), Page. 202, is generally used and in a case of a compound which is easily crystallized, it is possible to estimate the refractive index anisotropy Δn from the extrapolated value by performing evaluation as a mixture with another liquid crystal.

Examples of the liquid crystal compound exhibiting high refractive index anisotropy Δn include compounds described in US6514578B, JP3999400B, JP4117832B, JP4517416B, JP4836335B, JP5411770B, JP5411771B, JP5510321B, JP5705465B, JP5721484B, and JP5723641B.

Examples of preferable examples of the polymerizable liquid crystal compound used in the present invention include a compound represented by Formula (I) or (II). The compound represented by Formula (I) or (II) exhibits high refractive index anisotropy Δn.

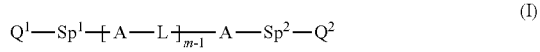
(I)

In the formula,

A represents a divalent aromatic ring group which may have a substituent,

L represents a single bond or a linking group selected from the group consisting of —C(=O)O—, —OC(=O)—, —NH—C(=O)—, —C(=O)—NH—, —CH=CH—C(=O)O—, and —OC(=O)—CH=CH—, m represents an integer of 2 to 12, Sp¹ and Sp² each independently represent a single bond, or a linking group selected from the group consisting of a linear or branched alkylene group having 1 to 20 carbon atoms and a group in which one or two or more —CH₂—'s in the linear or branched alkylene group having 1 to 20 carbon atoms are substituted with —O—, —S—, —NH—, -N(CH₃)—, —C(=O)—, —OC(=O)—, or —C(=O)O—, and Q¹ and Q² each independently represent a polymerizable group.

A is a divalent aromatic ring group which may have a substituent. The divalent aromatic ring group is a group formed by removing two hydrogen atoms from an aromatic ring, and examples of the aromatic ring include benzene, naphthalene, furan, thiophene, pyrrole, pyrazole, imidazole, pyridine, pyridazine, pyrimidine, and pyrazine. As the divalent aromatic ring group, a phenylene group is preferable, and a 1,4-phenylene group is particularly preferable. Each of m A's and m−1 L's may be the same or different from each other.

In the divalent aromatic ring group, the substituent of "which may have a substituent" is not particularly limited, and examples thereof include an alkyl group, a cycloalkyl group, an alkoxy group, an alkyl ether group, an amide group, an amino group, a halogen atom, and a substituent selected from the group consisting of groups formed by combining two or more of the above-mentioned substituent groups. In addition, as an example of the substituent is a substituent represented by —C(=O)—X³-Sp³-Q³. Here, X³ represents a single bond, —O—, —S—, —NH—, or —N(CH₃)—, Sp³ has the same meaning as Sp¹, and Q³ represents a polymerizable group. The divalent aromatic ring group may have 1 to 4 substituents. When the divalent aromatic ring group has two or more substituents, the two or more substituents may be the same or different from each other.

In the present specification, an alkyl group may be linear or branched. The number of carbon atoms of the alkyl group is preferably 1 to 30, more preferably 1 to 10, and particularly preferably 1 to 6. Examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a 1,1-dimethylpropyl group, an n-hexyl group, an isohexyl group, a linear or branched heptyl group, an octyl group, a nonyl group, a decyl group, an undecyl group, and a dodecyl group. The above description of the alkyl group applies to the alkoxy group containing an alkyl group in the same manner. Examples of the halogen atom include a fluorine atom, a chlorine atom, a bromine atom, and an iodine atom.

In the present specification, the number of carbon atoms of the cycloalkyl group is preferably 3 to 20, more preferably 5 to 10 or less. Examples of the cycloalkyl group include a cyclopropyl group, a cyclobutyl group, a cyclopentyl group, a cyclohexyl group, a cyclopentyl group, and a cyclooctyl group.

L represents a single bond or a linking group selected from the group consisting of —C(=O)O—, —OC(=O)—, —NH—C(=O)—, —C(=O)—NH—, —CH=CH—C(=O)O—, and —OC(=O)—CH=CH—. L is preferably —C(=O)O—, —OC(=O)—, —NH—C(=O)—, or —C(=O)—NH—. Each of m L's may be the same or different from each other.

m represents an integer of 2 to 12, preferably represents an integer of 3 to 7, and more preferably represents an integer of 3 to 5.

Sp¹ and Sp² each independently represent a single bond, or a linking group selected from the group consisting of a linear or branched alkylene group having 1 to 20 carbon atoms and a group in which one or two or more —CH₂—'s in the linear or branched alkylene group having 1 to 20 carbon atoms are substituted with —O—, —S—, —NH—, —N(CH₃)—, —C(=O)—, —OC(=O)—, or —C(=O)O—. Sp¹ and Sp² preferably each independently represent a linear alkylene group having 1 to 10 carbon atoms to which a linking group selected from the group consisting of —O—, —OC(=O)—, —C(=O)O—, and OC(=O)O— is respectively bonded to both terminals, and a linking group formed by combining one or two or more groups selected from the group consisting of —OC(=O)—, —C(=O)O—, —O—, and a linear alkylene group having 1 to 10 carbon atoms, and more preferably each independently represent a linear alkylene group having 1 to 10 carbon atoms to which a linking group selected from the group consisting of —O—, —OC(=O)—, —C(=O)O—, and —OC(=O)O— is respectively bonded to both terminals.

Q¹ and Q² each independently represent a polymerizable group, and preferably represent a polymerizable group selected from the group consisting of the groups represented by Formulae (Q-1) to (Q-5).

(Q-1)
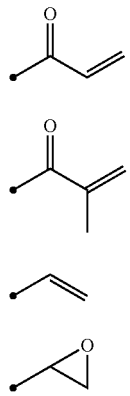
(Q-2)

(Q-3)

(Q-4)

(Q-5)
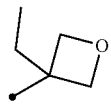

As the polymerizable group, an acryloyl group (Formula (Q-1)), a methacryloyl group (Formula (Q-2)) and an oxetanyl group (Formula (Q-5)) are preferable. A compound in which both $Q^1$ and $Q^2$ are acryloyl groups or methacryloyl groups, and a compound in which one of $Q^1$ and $Q^2$ is an acryloyl group or methacryloyl group and the other is an oxetanyl group is more preferable.

The compound represented by Formula (I) can be synthesized by the method described in JP 1999-513019A (JP-H11-513019A) (WO97/000600).

Examples of the polymerizable compound represented by Formula (I) are shown below, but the present invention is not limited to these examples.

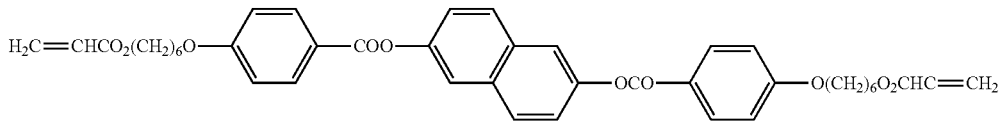

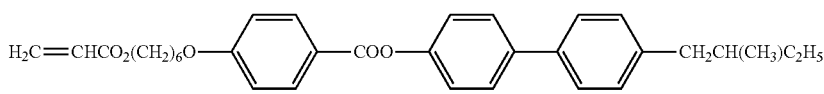

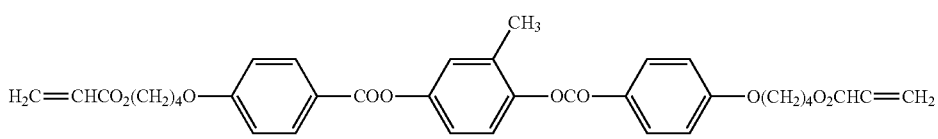

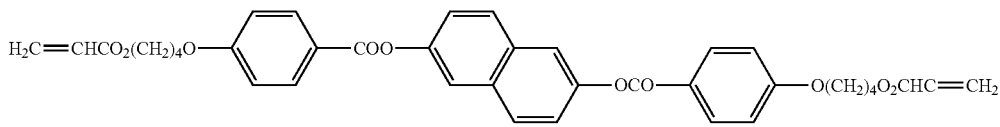

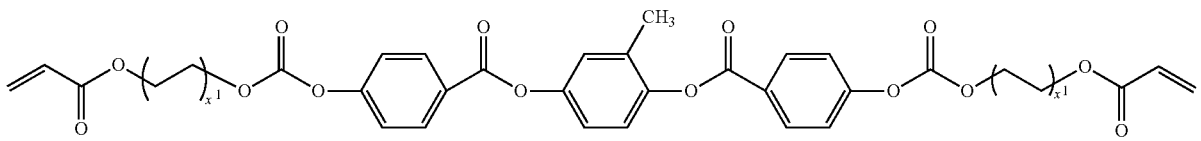

$X^1$ represents (an integer of) 2 to 5.
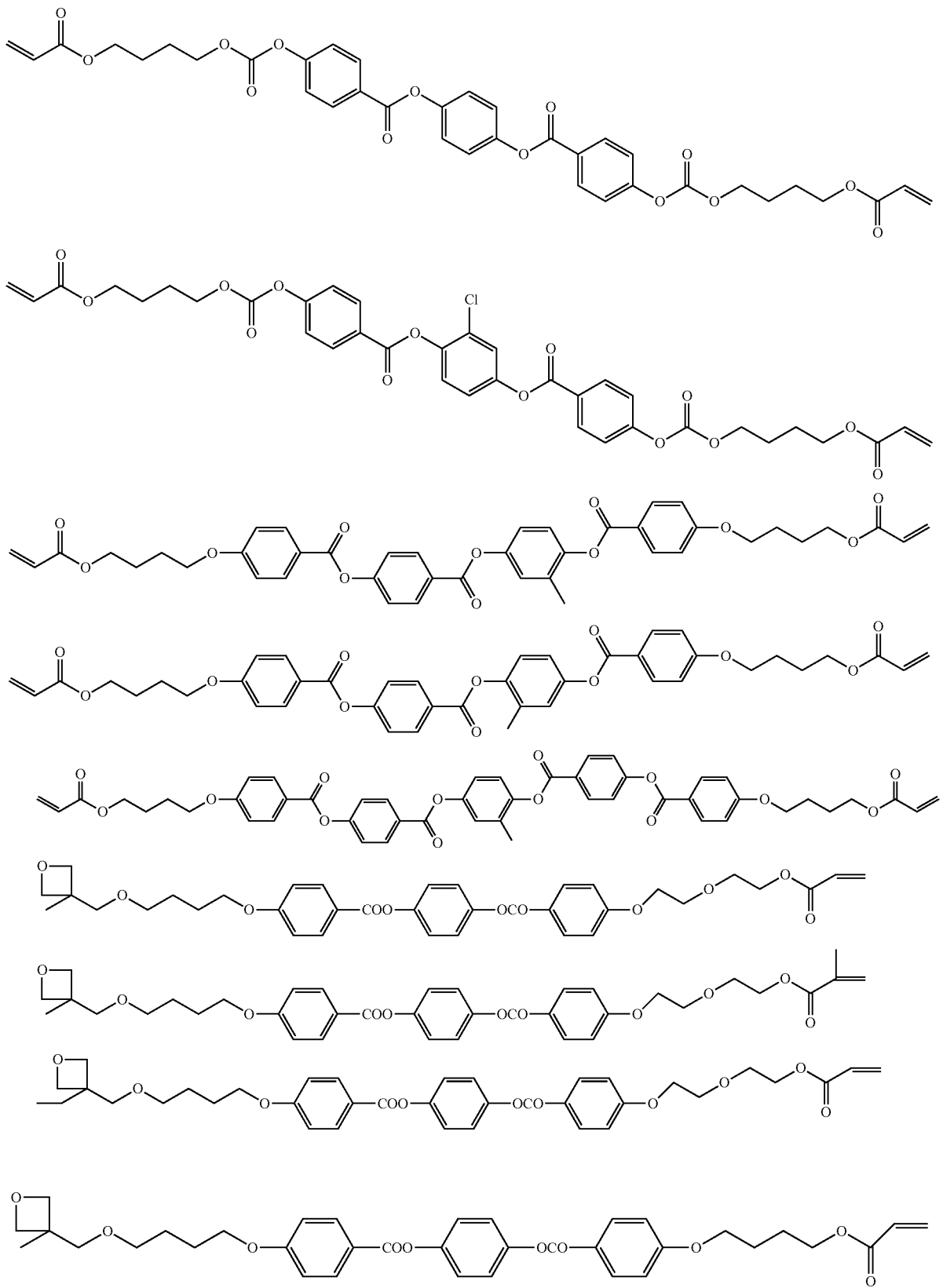
(II)

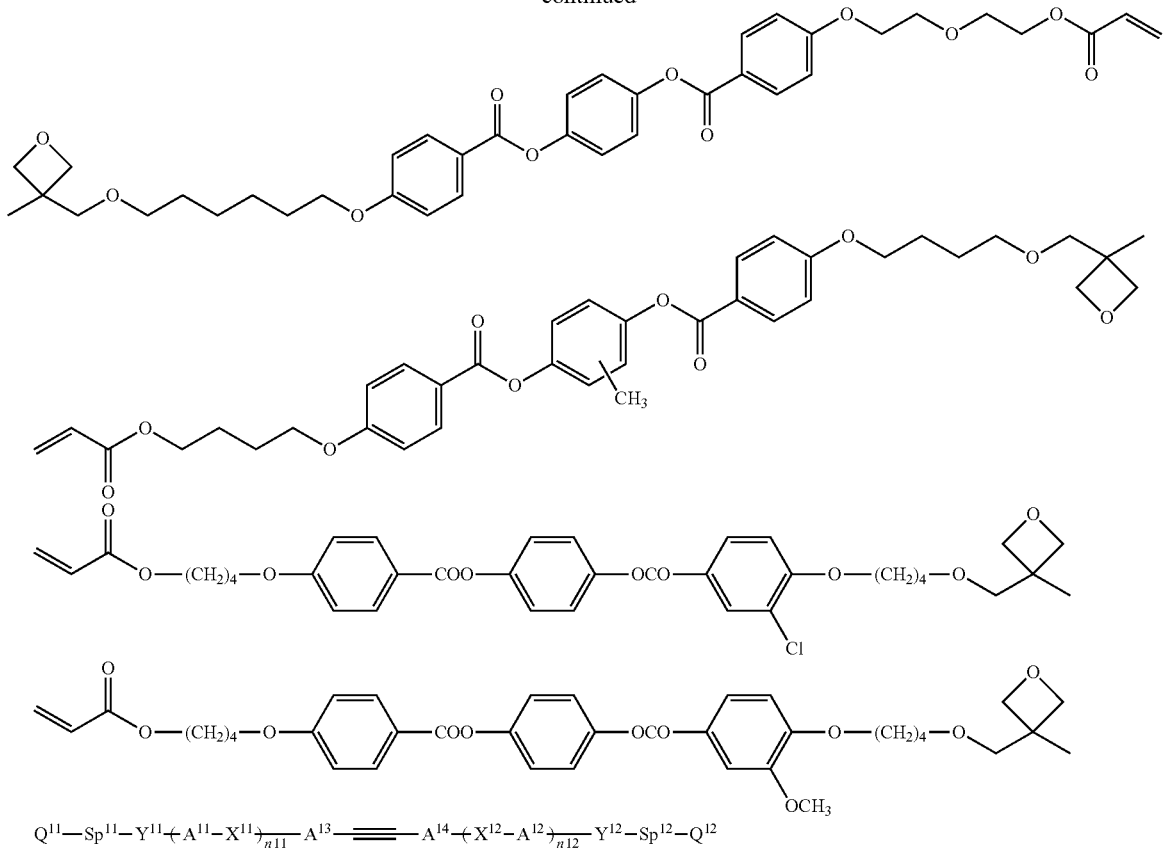

$A^{11}$ to $A^{14}$ each independently represent a divalent aromatic carbon group or a divalent heterocyclic group which may have a substituent. The divalent aromatic carbon group is a group formed by removing two hydrogen atoms from an aromatic carbon ring and the divalent heterocyclic group is a group formed by removing two hydrogen atoms from a heterocyclic ring. Examples of the aromatic carbon ring include a benzene ring and a naphthalene ring. Examples of the heterocyclic ring include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyran ring, a thiine ring, a pyridine ring, a piperidine ring, an oxazine ring, a morpholine ring, a thiazine ring, a pyridazine ring, a pyrimidine ring, a pyrazine ring, a piperazine ring, and a triazine ring. Among these, $A^{11}$ to $A^{14}$ preferably represent a divalent aromatic carbon group, more preferably represent a phenylene group, and even more preferably represent a 1,4-phenylene group.

The kind of the substituent which may be substituted on the aromatic carbon group or heterocyclic group is not particularly limited and examples thereof include a halogen atom, a cyano group, a nitro group, an alkyl group, a halogen substituted alkyl group, an alkoxy group, an alkylthio group, an acyloxy group, an alkoxycarbonyl group, a carbamoyl group, an alkyl substituted carbamoyl group, and an acylamino group having 2 to 6 carbon atoms.

$X^{11}$ and $X^{12}$ each independently represent a single bond or —COO—, —OCO—, —CONH—, —NHCO—, —CH$_2$CH$_2$—, —OCH$_2$—, —CH$_2$O—, —CH═CH—, —CH═CH—COO—, —OCO—CH═CH— or Among these, a single bond, —COO—, —CONH—, —NHCO—, or —C≡C— is preferable.

$Y^{11}$ and $Y^{12}$ each independently represent a single bond or —O—, —S—, —CO—, —COO—, —OCO—, —CONH—, —NHCO—, —CH═CH—, —CH═CH—COO—, —OCO—CH═CH—, —C≡C—. Among these, —O— is preferable.

$Sp^{11}$ and $Sp^{12}$ each independently represent a single bond or an alkylene group having 1 to 25 carbon atoms. The alkylene group may be linear, branched, or cyclic. Among these, an alkylene group having 1 to 10 carbon atoms is more preferable.

$Q^{11}$ and $Q^{12}$ each independently represent a hydrogen atom or a polymerizable group, and at least one of Q11 or $Q^{12}$ represents a polymerizable group. Examples of the polymerizable group include polymerizable groups selected from the group consisting of the groups represented by Formulae (Q-1) to (Q-5). As the polymerizable group represented by $Q^{11}$ or $Q^{12}$, an acryloyl group (Formula (Q-1)) and a methacryloyl group (Formula (Q-2)) are preferable.

$n^{11}$ and $n^{12}$ each independently represent an integer of 0 to 2, and in a case where $n^{11}$ or $n^{12}$ is 2, a plurality of $A^{11}$'s $A^{12}$'s $X^{11}$'s and $X^{12}$'s may be the same or different from each other.

Specific examples of the compound represented by Formula (II) include the compounds shown in Formulas (2-1) to (2-30).

(2-1)
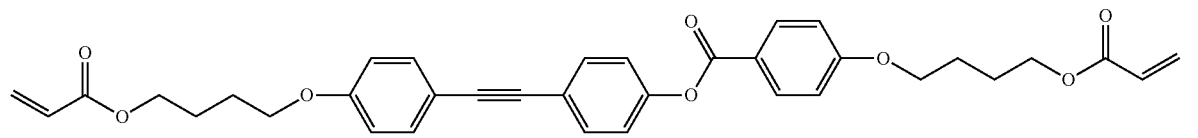
(2-2)
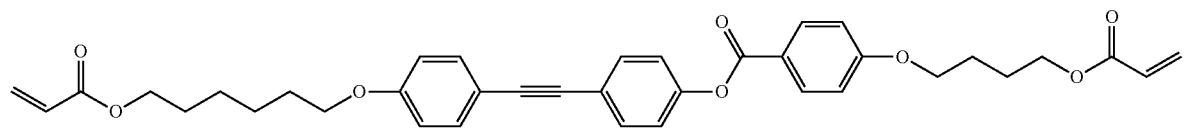
(2-3)
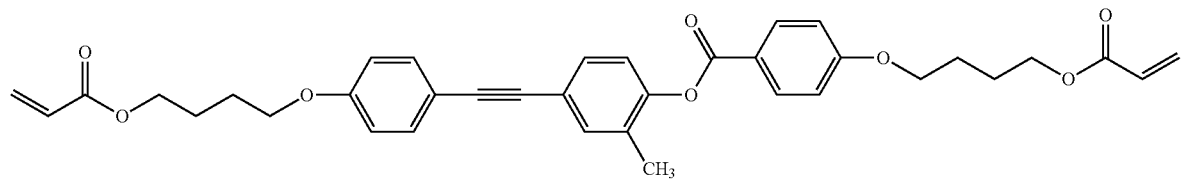
(2-4)
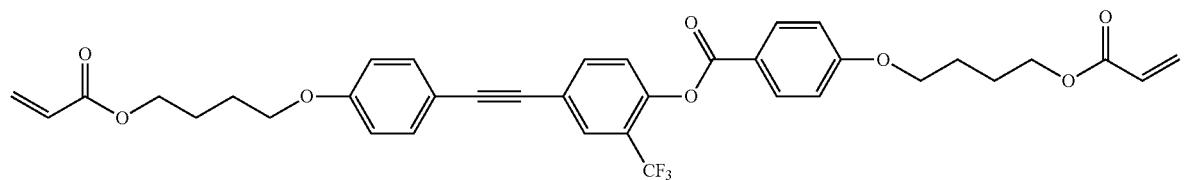
(2-5)
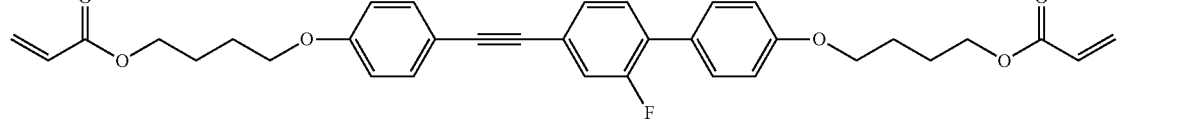
(2-6)
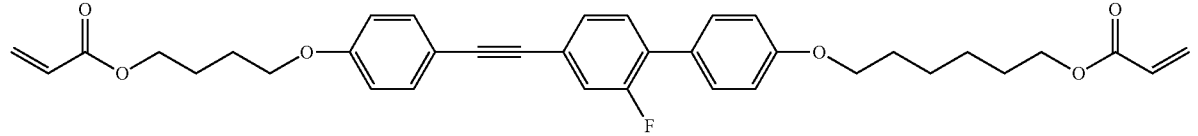
(2-7)
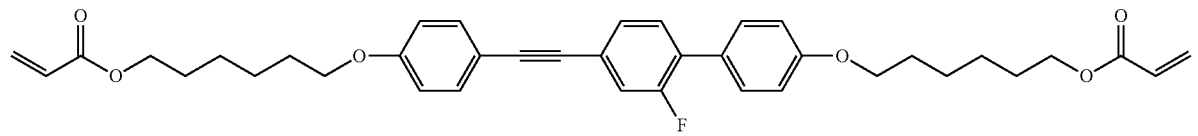
(2-8)
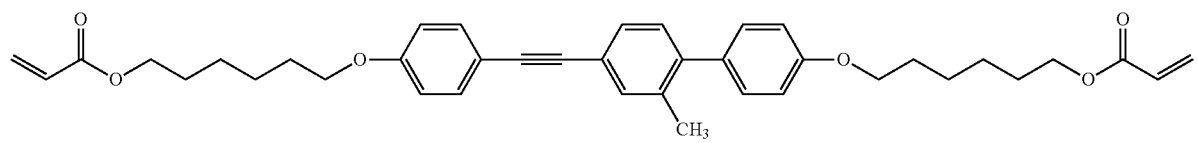
(2-9)
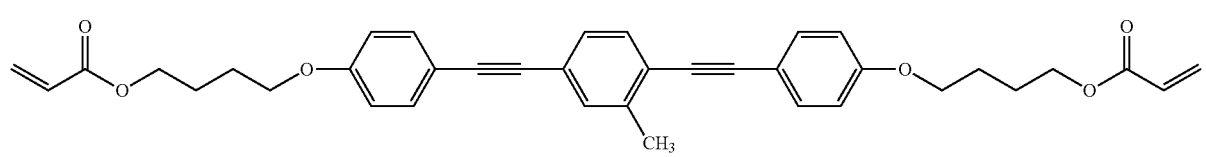

(2-10)
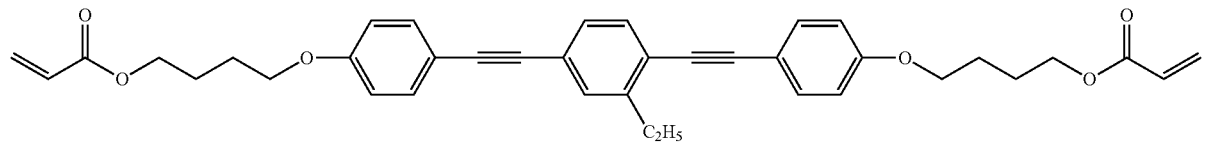
(2-11)
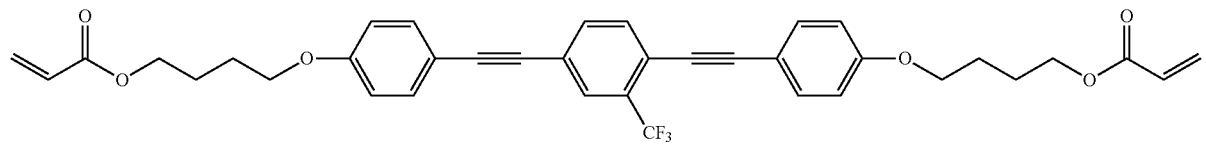
(2-12)
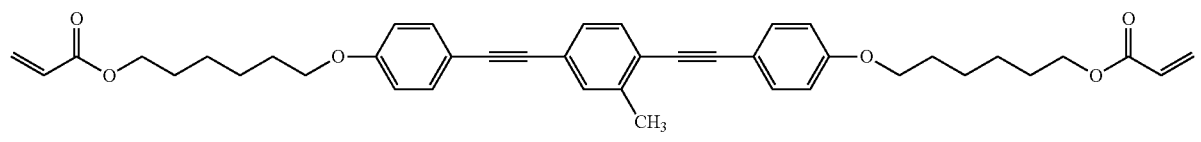
(2-13)
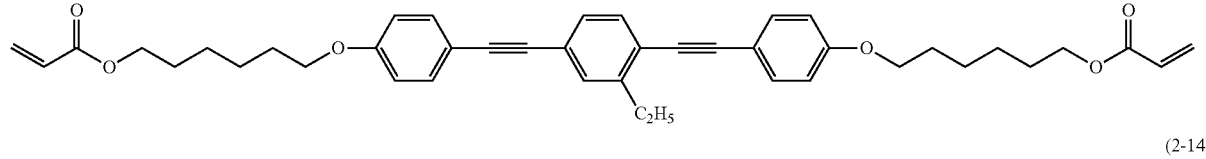
(2-14)
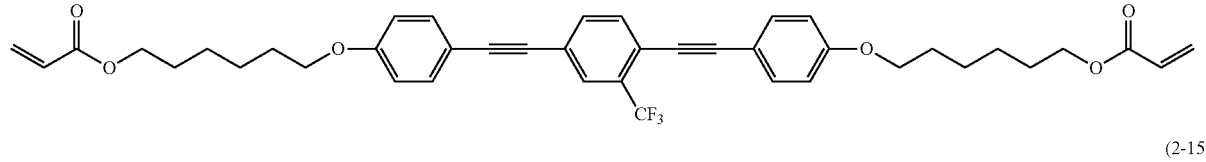
(2-15)
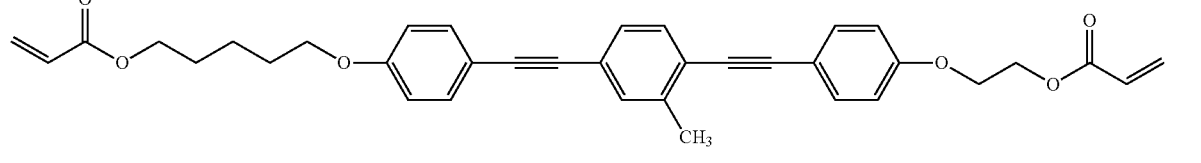
(2-16)
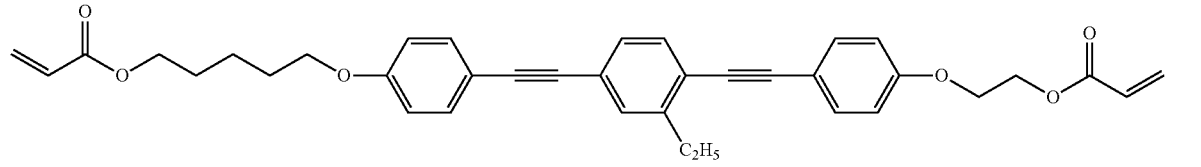
(2-17)
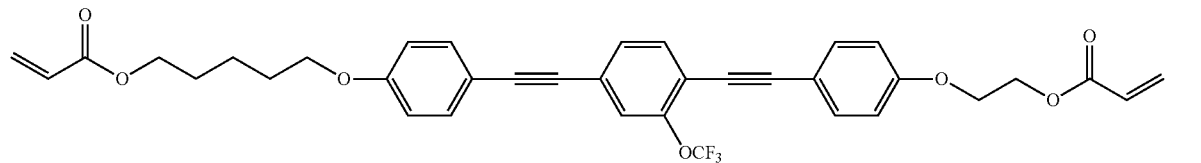
(2-18)
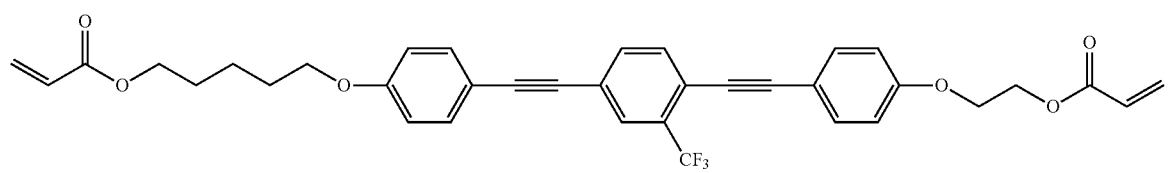

-continued
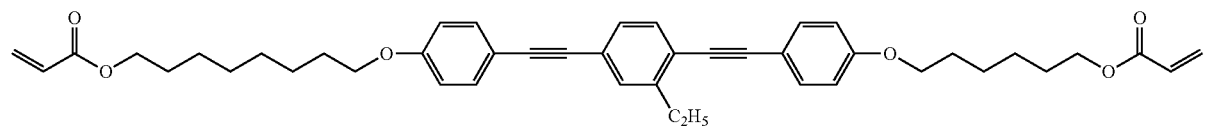
(2-19)
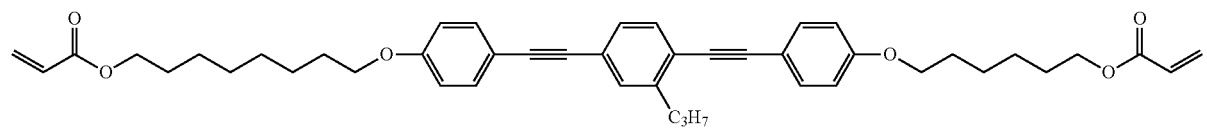
(2-20)
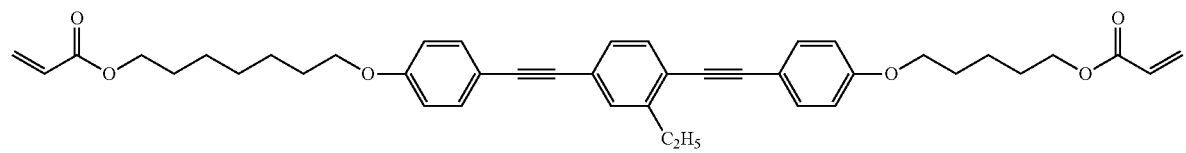
(2-21)
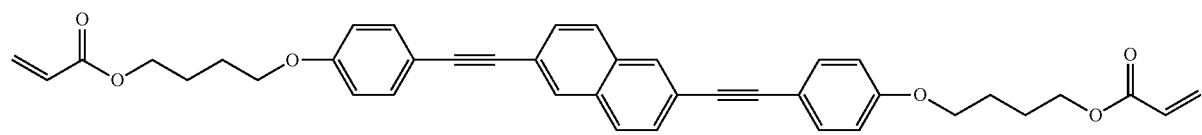
(2-22)
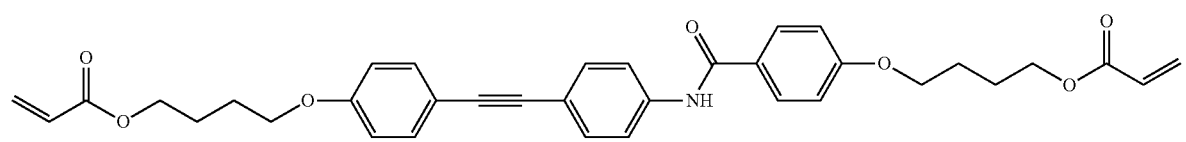
(2-23)
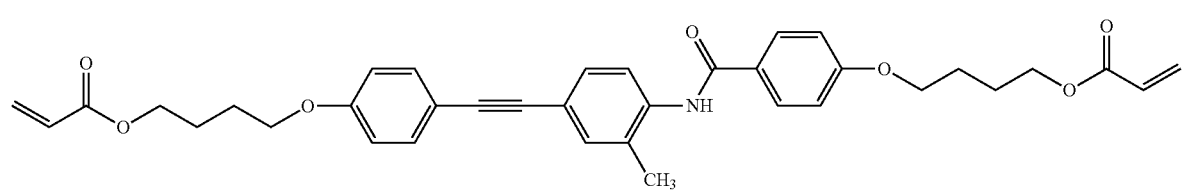
(2-24)
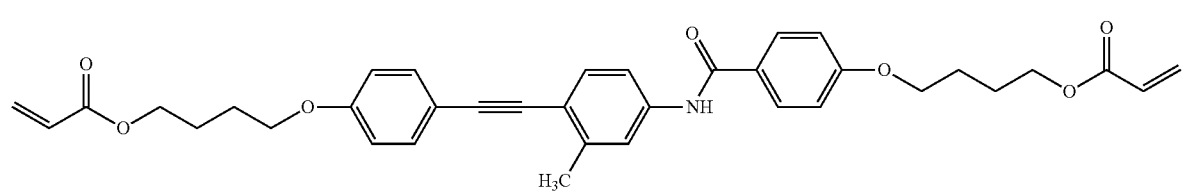
(2-25)
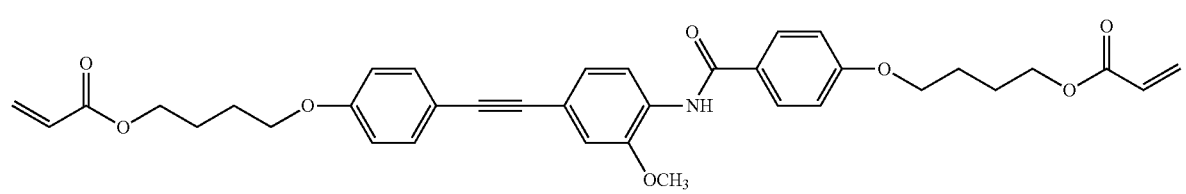
(2-26)

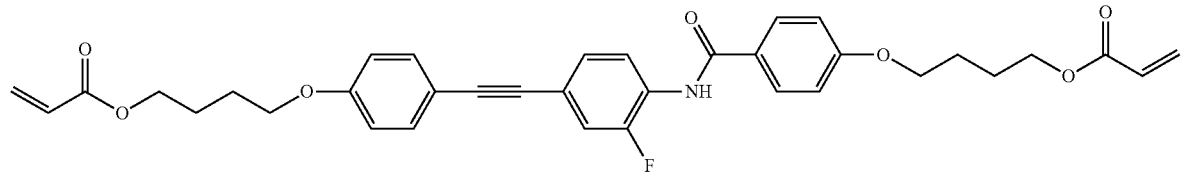

(2-27)

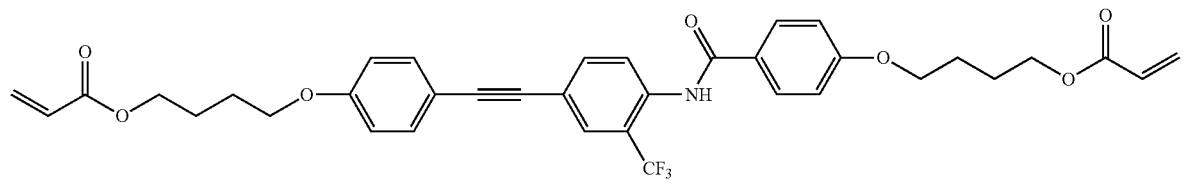

(2-28)

(2-29)

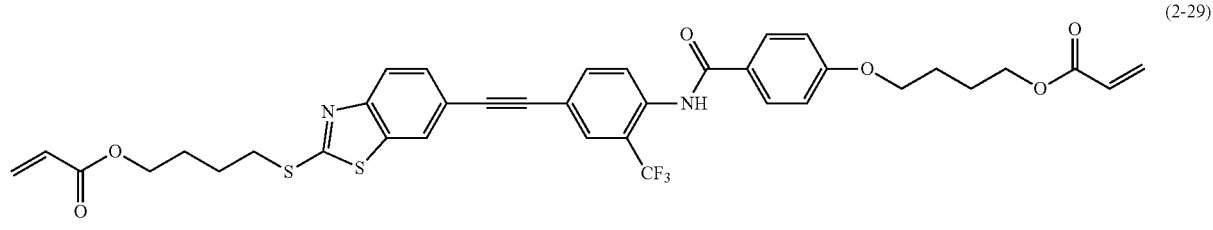

(2-30)

Two or more of polymerizable liquid crystal compounds may be used in combination. In a case where two or more polymerizable liquid crystal compounds are used together, the alignment temperature can be lowered.

In addition, in a case where a liquid crystal compound having two or more reactive groups having different polymerization conditions in the same molecule and a liquid crystal compound having two or more reactive groups having the same polymerization condition in the same molecule are used in combination, the reflection range of the selective reflection can be widened and thus this case is more preferable. Specifically, a combination of a liquid crystal compound containing a (meth)acryloyl group and an oxetanyl group and a liquid crystal compound containing two (meth)acryloyl groups can be exemplified.

The amount of the polymerizable liquid crystal compound added in the liquid crystal composition is preferably 80% to 99.9% by mass, more preferably 85% to 99.5% by mass, and particularly preferably 90% to 99% by mass with respect to the solid content mass (excluding the solvent) of the liquid crystal composition.

(Chiral Agent: Optically Active Compound)

It is preferable that the material used for forming the cholesteric liquid crystal layer includes a chiral agent. The chiral agent has a function of causing a helical structure of a cholesteric liquid crystalline phase. The chiral compound may be selected depending on the purpose because the sense of the helix or the helical pitch derived from the compound varies.

The chiral agent is not particularly limited, and a well-known compound can be used. Examples of the chiral agent include compounds described in Liquid Crystal Device Handbook (No. 142 Committee of Japan Society for the Promotion of Science, 1989, Chapter 3, Article 4-3, chiral agent for TN or STN, p. 199), JP2003-287623A, JP2002-302487A, JP2002-080478A, JP2002-080851A, JP2010-181852A, and JP2014-034581A.

Although the chiral agent generally contains an asymmetric carbon atom, an axial asymmetric compound or planar asymmetric compound not containing an asymmetric carbon atom can also be used as the chiral agent. Examples of the axial asymmetric compound or the planar asymmetric compound include binaphthyl, helixene, paracyclophane, and derivatives thereof. The chiral agent may have a polymerizable group. In a case where both the chiral agent and the liquid crystal compound have a polymerizable group, a polymer having a repeating unit derived from the polymerizable liquid crystal compound and a repeating unit derived from the chiral agent can be formed by the polymerization reaction between the polymerizable chiral agent and the polymerizable liquid crystal compound. In this embodiment, the polymerizable group in the polymerizable chiral agent is preferably the same group as the polymerizable group in the polymerizable liquid crystal compound. Accordingly, the polymerizable group of the chiral agent is preferably an unsaturated polymerizable group, an epoxy group or an aziridinyl group, and more preferably an unsaturated polymerizable group, and particularly preferably an ethylenically unsaturated polymerizable group.

In addition, the chiral agent may be a liquid crystal compound.

As the chiral agent, an isosorbide derivative, an isomannide derivative, and a binaphthyl derivative can be preferably used. As the isosorbide derivative, commercially available products such as LC-756 manufactured by BASF SE may be used.

The content of the chiral agent in the liquid crystal composition is preferably 0.01% by mole to 200% by mole and more preferably 1% by mole to 30% by mole with respect to the total molar amount of the polymerizable liquid crystal compound.

(Polymerization Initiator)

It is preferable that the liquid crystal composition contains a polymerization initiator. In a state in which a polymerization reaction is carried out by ultraviolet irradiation, it is preferable that a polymerization initiator to be used is a photopolymerization initiator which can initiate a polymerization reaction by ultraviolet irradiation. Examples of photopolymerization initiators include a radical polymerization initiator and a cation polymerization initiator.

Examples of the radical polymerization initiator include an α-carbonyl compound (described in the specification of each of U.S. Pat. Nos. 2,367,661A and 2,367,670A), acyloin ether (described in the specification of U.S. Pat. No. 2,448,828A), an α-hydrocarbon-substituted aromatic acyloin compound (described in the specification of U.S. Pat. No. 2,722,512A), a polynuclear quinone compound (described in the specification of each of U.S. Pat. Nos. 3,046,127A and 2,951,758A), a combination between a triaryl imidazole dimer and p-aminophenyl ketone (described in the specification of U.S. Pat. No. 3,549,367A), an acridine compound and a phenazine compound (described in JP1985-105667A (JP-S60-105667A) and in the specification of U.S. Pat. No. 4,239,850A), an acylphosphineoxide compound (described in the specification of each of JP1988-040799B (JP-S63-040799B), JP1993-029234B (JP-H05-029234B), JP1998-095788A (JP-H10-095788A), and JP1998-029997A (JP-H10-029997A), JP2001-233842A, JP2000-080068A, JP2006-342166A, JP2013-114249A, JP2014-137466A, JP4223071B, JP2010-262028A, and JP2014-500852A), an oxime compound (described in the specification of each of JP2000-066385A and JP4454067B), and an oxadiazole compound (described in the specification of U.S. Pat. No. 4,212,970A). For example, the description in paragraphs 0500 to 0547 of JP2012-208494A can also be referred to.

As the radical polymerization initiator, it is preferable to use an acylphosphine oxide compound or an oxime compound.

As the acylphosphineoxide compound, for example, IRGACURE 819 manufactured by BASF SE (compound name: bis(2,4,6-trimethylbenzoyl)-phenylphosphineoxide) which is a commercially available product can be used. As the oxime compound, IRGACURE OXE01 (manufactured by BASF SE), IRGACURE OXE02 (manufactured by BASF SE), TR-PBG-304 (manufactured by Changzhou Tronly New Electronic Materials Co., Ltd.), ADEKA ARKLS NCI-831 and ADEKA ARKLS NCI-930 (manufactured by ADEKA CORPORATION), which are commercially available products can be used.

Examples of the cationic polymerization initiator include organic sulfonium salt-based, iodonium salt-based, and phosphonium salt-based compounds, an organic sulfonium salt-based compound is preferable and a triphenylsulfonium salt is particularly preferable. As counter ions of these compounds, hexafluoroantimonate, hexafluorophosphate and the like are preferably used.

The polymerization initiator may be used alone or in combination of two or more thereof.

The content of the photopolymerization initiator in the liquid crystal composition is preferably 0.1% by mass to 20% by mass and more preferably 0.5% by mass to 5% by mass with respect to the content of the polymerizable liquid crystal compound.

(Crosslinking Agent)

The liquid crystal composition may optionally contain a crosslinking agent in order to improve film hardness after curing and improve durability. As the crosslinking agent, those that are curable by ultraviolet rays, heat, moisture or the like can be suitably used.

The crosslinking agent is not particularly limited, and can be appropriately selected according to the purpose. Examples thereof include polyfunctional acrylate compounds such as trimethylolpropane tri(meth)acrylate, pentaerythritol tri(meth)acrylate, and pentaerythritol tetra(meth)acrylate; epoxy compounds such as glycidyl(meth)acrylate and ethylene glycol diglycidyl ether; aziridine compounds such as 2,2-bis-hydroxymethyl butanol-tris[3-(1-aziridinyl)propionate] and 4,4-bis(ethyleneiminocarbonylamino)diphenylmethane; isocyanate compounds such as hexamethylene diisocyanate and biuret type isocyanate; polyoxazoline compounds having an oxazoline group on a side chain; and alkoxysilane compounds such as vinyltrimethoxysilane and N-(2-aminoethyl)-3-aminopropyltrimethoxysilane. Among these, polyfunctional acrylate compounds are preferable. As the polyfunctional acrylate compound, a tri- to hexafunctional acrylate compound is preferable, and a tetra- to hexafunctional acrylate compound is more preferable. Furthermore, according to the reactivity of the crosslinking agent, a known catalyst can be used, and the productivity can be improved in addition to the improvement of film hardness and durability. These may be used alone or in combination of two or more thereof.

The content of the crosslinking agent in the liquid crystal composition is preferably more than 0 parts by mass and 8.0 parts by mass, more preferably 0.1 parts by mass to 7.0 parts by mass, and even more preferably 0.2 parts by mass to 5.5 parts by mass with respect to 100 parts by mass of the polymerizable liquid crystal compound in the liquid crystal composition.

(Alignment Control Agent)

In the liquid crystal composition, an alignment control agent which contributes to planar alignment stably or rapidly may be added. Examples of the alignment control agent include fluorine (meth)acrylate-based polymers described in paragraphs [0018] to [0043] of JP2007-272185A, and compounds represented by Formulae (I) to (IV) described in paragraphs to [0034] of JP2012-203237A.

The alignment control agent may be used alone or in combination of two or more thereof.

The amount of the alignment control agent added in the liquid crystal composition is preferably 0.01% by mass to 10% by mass, more preferably 0.01% by mass to 5.0% by mass, and particularly preferably 0.02% by mass to 1.0% by mass with respect to the total mass of the polymerizable liquid crystal compound.

(Other Additives)

In addition, the liquid crystal composition may contain at least one component selected from various additives such as a surfactant, which is for making the film thickness uniform by adjusting the surface tension of the coating film, and a polymerizable monomer. Furthermore, if necessary, a polymerization inhibitor, an antioxidant, an ultraviolet absorber, a light stabilizer, a coloring material, metal oxide particles, and the like can be added to the liquid crystal composition within a range that does not deteriorate the optical performance.

(Solvent)

The solvent used for preparing the liquid crystal composition is not particularly limited and can be appropriately selected according to the purpose. However, it is preferable to use an organic solvent.

The organic solvent is not particularly limited and can be appropriately selected according to the purpose. Examples of the organic solvent include ketones, alkyl halides, amides, sulfoxides, heterocyclic compounds, hydrocarbons, esters, ethers, and the like. These may be used alone or in combination of two or more thereof. Among these, considering the load imposed on the environment, ketones are particularly preferable.

(Coating, Alignment, and Polymerization)

The method of applying the liquid crystal composition to a support, an alignment film, a ¼ wavelength plate, and a cholesteric liquid crystal layer which becomes an underlayer is not particularly limited and can be appropriately selected according to the purpose. Examples of the coating method include a wire bar coating method, a curtain coating method, an extrusion coating method, a direct gravure coating method, a reverse gravure coating method, a die coating method, a spin coating method, a dip coating method, a spray coating method, and a slide coating method. Furthermore, the coating method can be performed by transferring the liquid crystal composition, which is separately applied onto a support. By heating the applied liquid crystal composition, the liquid crystal molecules are aligned. Cholesteric alignment may be performed in forming the cholesteric liquid crystal layer, and nematic alignment may be performed in forming the ¼ wavelength plate. In the case of cholesteric alignment, the heating temperature is preferably 200° C. or lower and more preferably 130° C. or lower. By this alignment treatment, an optical thin film is obtained in which the polymerizable liquid crystal compound is twist-aligned so as to have a helical axis in a direction substantially perpendicular to the film surface. In the case of the nematic alignment, the heating temperature is preferably 50° C. to 120° C. and more preferably 60° C. to 100° C.

The aligned liquid crystal compound can be further polymerized to cure the liquid crystal composition. The polymerization may be any of thermal polymerization and photopolymerization performed using light irradiation, but photopolymerization is preferable. It is preferable to use ultraviolet rays for the light irradiation. The irradiation energy is preferably 20 mJ/cm$^2$ to 50 J/cm$^2$ and more preferably 100 mJ/cm$^2$ to 1,500 mJ/cm$^2$. In order to accelerate the photopolymerization reaction, the light irradiation may be performed under heating conditions or in a nitrogen atmosphere. The wavelength of the ultraviolet rays for irradiation is preferably 350 nm to 430 nm. From the viewpoint of stability, the polymerization reaction rate is preferably high. The polymerization reaction rate is preferably 70% or more and more preferably 80% or more. The polymerization reaction rate can be determined by measuring the consumption rate of polymerizable functional groups by using an IR absorption spectrum.

The thickness of each of the cholesteric liquid crystal layers is not particularly limited as long as the above properties are exhibited. The thickness is preferably in a range of 1.0 μm or more and 20 μm or less and more preferably in a range of 2.0 μm or more and 10 μm or less.

(Support)

The liquid crystal composition may be applied to a support or the surface of an alignment layer formed on the surface of the support to form a layer. The support or the support and the alignment layer may be peeled off after layer formation. For example, the layer may be peeled off after bonding to the light emitting element substrate. Examples of the support include polyester such as polyethylene terephthalate (PET), polycarbonate, an acrylic resin, an epoxy resin, polyurethane, polyamide, polyolefin, a cellulose derivative, silicone, and a glass plate.

The thickness of the support may be about 5 μm to 1000 μm, preferably 10 μm to 250 μm, and more preferably 15 μm to 120 μm.

(Alignment Layer)

In a case of forming a cholesteric liquid crystal layer, it is preferable to regulate the alignment state of the liquid crystal composition by an alignment layer provided directly on or above the support. The alignment layer may be any layer as long as alignment can be imparted to the optically anisotropic layer. Preferable examples of the alignment layer include a rubbed layer of an organic compound such as a polymer (resin such as polyimide, polyvinyl alcohol, polyester, polyarylate, polyamide imide, polyether imide, polyamide, or modified polyamide), a photo alignment layer that exhibits liquid crystal alignment by polarized light irradiation represented by an azobenzene polymer and a cinnamate polymer, an oblique deposition layer of an inorganic compound, a layer with microgrooves, an accumulation film formed of ω-trichosanic acid, dioctadecyl methyl ammonium chloride and methyl stearylate by the Langmuir-Blodgett method (LB film), and a layer in which the dielectric is aligned by application of an electric field or a magnetic field. As the alignment layer, the rubbing layer preferably contains polyvinyl alcohol, and the alignment layer is particularly preferably crosslinkable with at least one layer above or below the alignment layer. Specifically, alignment layers described in JP2009-069793A, JP2010-113249A, and JP2011-203636A can be used. Also, a photo alignment layer can be suitably used. In a case where a photo alignment layer is used, the generation of alignment defects due to minute foreign substances can be suppressed, and the cholesteric liquid crystal layer can be formed with high optical performance even with a fine shape. For example, a liquid crystal alignment agent described in JP2015-26050A (for example, a liquid crystal alignment agent containing an epoxy-containing polyorganosiloxane) can be used. In order to sufficiently exhibit the alignment control force of the alignment layer, the temperature of the applied liquid crystal composition may be controlled to carry out a treatment (alignment treatment) to develop a desired phase.

The thickness of the alignment layer is preferably 0.01 μm to 5.0 μm, and more preferably 0.05 μm to 2.0 μm.

(Patterning Method)

A cholesteric liquid crystal layer can be formed by patterning to form a polarization separation layer including a plurality of polarization separation sites exhibiting polarization separation at different wavelengths. The light utilization efficiency can be further enhanced by using a patterned cholesteric liquid crystal layer in which the selective reflection wavelength is adjusted corresponding to the light emission wavelength of each organic electroluminescent layer of the light emitting element substrate. By forming a cholesteric liquid crystal layer by the patterning method, a polarization separation site and a visible light transmission region in the polarization separation layer can be formed, and the polarization separation sites arranged in the matrix form can also be formed.

As the patterning method, a method by solvent development or a method using photoisomerization chiral agent (JP2001-159706A), a method in which alignment is immobilized in advance, and a cholesteric liquid crystal layer is transferred using a laser or a thermal head (JP2001-004822A and JP2001-004824A), an ink jet method (JP2001-159709A), a method of using temperature dependency of a cholesteric helical pitch (JP2001-159708A), and a method of stepwise changing the amount of ultraviolet irradiation in a case of curing a liquid crystal composition between regions may be used.

As an example, a method using a photoisomerization chiral agent can be performed as follows. First, a liquid crystal composition containing a photoisomerization chiral agent is used to form a cholesteric liquid crystal layer having a center wavelength of selective reflection in an ultraviolet light wavelength range on the entire surface. Then, a part of the cholesteric liquid crystal layer is immobilized in a state of having a center wavelength of selective reflection in an ultraviolet light wavelength range or an infrared light wavelength range by pattern exposure (ultraviolet irradiation) to form a visible light transmission region. Subsequently, light having an absorption wavelength of the chiral agent is selectively emitted to each region with an appropriate light amount according to each of regions having the center wavelength of the selective reflection to be formed. Thus, the chiral agent is isomerized to obtain the pitch of the helical structure according to each region. Finally, by irradiating the entire surface with ultraviolet rays to immobilize the alignment of each region, a polarization separation layer having a visible light transmission region and a pattern of a cholesteric liquid crystal layer having a center wavelength of selective reflection in a desired wavelength range can be formed in one layer.

In the patterning method, pattern exposure can be performed as described above.

The method of pattern exposure includes contact exposure using a mask, proxy exposure, projection exposure and the like. The irradiation wavelength of the light source for the above exposure preferably has a peak at 250 to 450 nm, and more preferably a peak at 300 to 410 nm. Specifically, an ultrahigh pressure mercury lamp, a high pressure mercury lamp, a metal halide lamp, a blue laser and the like can be used. The preferable exposure dose is usually about 3 to 2000 mJ/cm$^2$, more preferably about 5 to 1000 mJ/cm$^2$, even more preferably about 10 to 500 mJ/cm$^2$, and most preferably about 10 to 100 mJ/cm$^2$.

Depending on the material used, pattern heating may or may not be performed instead of pattern exposure. As the method of pattern heating, contact heating using a heated patterning plate, heating by an infrared laser, or the like can be used.

In addition, both methods may be combined.

It is also possible to form a polarization separation layer constituted of a plurality of layers as follows using pattern exposure. That is, after pattern exposure is performed on a layer formed of a first liquid crystal composition, a layer formed of a new second liquid crystal composition can be formed or transferred thereon, and then another pattern exposure can be performed. Furthermore, a layer formed of a new third liquid crystal composition can be formed or transferred thereon, and then another pattern exposure can be performed.

The first liquid crystal composition, the second liquid crystal composition, and the third liquid crystal composition may be derived from the same composition, or may be derived from different compositions. It is also preferable to use three liquid crystal compositions which differ only in the concentration of the chiral agent.

The unexposed portion can be made optically isotropic by heating the layer of the pattern-exposed liquid crystal composition at 50° C. to 400° C. and preferably at 80° C. to 200° C. In this manner, a layer having a cholesteric liquid crystal layer in a pattern can be formed. A region which is optically isotropic may be formed to separate the polarization separation site and may be used as a visible light transmission region. A polarization separation layer can be formed by forming each layer having a cholesteric liquid crystal layer in a pattern so as to have a wavelength range corresponding to the color of the light emitted from the organic electroluminescent layer of the light emitting element substrate with respect to a cholesteric liquid crystal layer having a center wavelength of selective reflection in the wavelength range of red light, a cholesteric liquid crystal layer having a center wavelength of selective reflection in the wavelength range of green light, and a cholesteric liquid crystal layer having a center wavelength of selective reflection in the wavelength range of blue light, and laminating a plurality of the layers.

The pattern exposure and the formation of the patterned cholesteric liquid crystal layer (optically anisotropic layer) described in JP2009-069793A, JP2010-113249A, and JP2011-203636A can be referred to.

(Protective Layer (Additive Layer))

Particularly, in a case of forming a polarization separation layer having a polarization separation site in a pattern using a liquid crystal composition, a protective layer may be used. The protective layer may contain at least one or more polymerization initiators having a function of initiating polymerization reaction by unreacted reactive groups remaining after temporary curing of the liquid crystal composition. It is preferable that the cholesteric liquid crystal layer and the protective layer be in direct contact with each other. Although the structure of the protective layer containing a polymerization initiator is not particularly limited, it is preferable to contain at least one polymer other than the polymerization initiator.

The polymer (sometimes referred to as "binder" as another name in the present invention) is not particularly limited, and examples thereof include polymethyl (meth)acrylate, copolymers of (meth)acrylic acid and its various esters, polystyrene, copolymers of styrene and (meth)acrylic acid or various (meth)acrylic acid esters, polyvinyl toluene, copolymers of vinyl toluene and (meth)acrylic acid or various (meth)acrylic esters, a styrene-vinyl toluene copolymer, polyvinyl chloride, polyvinylidene chloride, polyvinyl acetate, a vinyl acetate-ethylene copolymer, a vinyl acetate-vinyl chloride copolymer, polyester, polyimide, carboxymethylcellulose, polyethylene, polypropylene and polycarbonate. Preferable examples include a copolymer of methyl (meth)acrylate and (meth)acrylic acid, a copolymer of allyl (meth)acrylate and (meth)acrylic acid, and a multi-component copolymer of benzyl (meth)acrylate, (meth)acrylic acid and other monomers. These polymers may be used alone or in combination of two or more thereof. The content of the polymer with respect to the total solid content is generally 20% to 99% by mass, preferably 40% to 99% by mass, and more preferably 60% to 98% by mass.

(Method of Preparing Polarization Separation Layer)

The polarization separation layer including the cholesteric liquid crystal layer may be formed on the organic electroluminescent layer and a separately formed polarization separation layer or a laminate including the polarization separation layer may be laminated on the organic electroluminescent layer. Typically, it is preferable that a polarization separation layer is formed on a light emitting element substrate including an organic electroluminescent layer group, a circularly polarizing plate is further formed thereon, or a laminate of the polarization separation layer and a circularly polarizing plate is prepared, and then this laminate is provided on the light emitting element substrate including an organic electroluminescent layer group, and the former is more preferable.

[Positive C Region-Containing Layer]

The organic EL image display device according to the embodiment of the present invention includes a positive C region-containing layer. In the present specification, the positive C region is a region that exhibits optically positive C performance and has optical properties expressed as a refractive index ellipsoid in which when the thickness direction of the layer is set to a z axis and the in-plane direction of the layer is set to an xy plane, respective refractive indices Nx, Ny, and Nz are expressed as a relationship of Nz>Nx=Ny. The positive C region-containing layer may be a layer formed of a positive C region, that is, a single positive C-plate, or may be a layer including both a positive C region and an optically isotropic region in the xy plane, and further, may be a layer including a region having other optical properties.

In the organic EL image display device including a cholesteric liquid crystal layer in the polarization separation layer, by further providing the positive C region-containing layer, light leakage can be reduced at the time of oblique observation. This is because at the wavelength of the visible light region not corresponding to the selective reflection wavelength range, the cholesteric liquid crystal layer exhibiting positive Rth optically compensates the positive C region exhibiting negative Rth.

The present inventors have found that in the organic EL image display device according to the embodiment of the present invention further including the polarization separation layer including the polarization separation region formed by immobilizing a cholesteric liquid crystalline phase and the optically isotropic region, in a case where the positive C region-containing layer includes a layer including a positive C region, by setting the absolute value of the retardation Rth(X) of the positive C region in the film thickness direction at a wavelength X to a value between the absolute value of the retardation Rth-Ch(X) of the polarization separation region in the film thickness direction at the wavelength X and the absolute value of the retardation Rth-T(X) of the visible light transmission region at the wavelength X, the light leakage at the time of oblique observation and coloring can be reduced. Here, X represents an arbitrary wavelength in the visible light region (for example, 550 nm).

In a case where Rth-Ch(X) and Rth-T(X) are different, the values of Rth(X) of the positive C region respectively required for the optical compensation are different. Thus it is considered that by setting the absolute value to a value between the both absolute values, the light leakage of both regions can be reduced. At this time, the absolute value of Rth(X) of the positive C region may be an arbitrary value between the absolute value of Rth-Ch(X) and the absolute value of Rth-T(X), but is preferably the average value of the absolute value of Rth-Ch(X) and the absolute value of Rth-T(X)±20 nm and more preferably the average value±10 nm.

In a case of a cholesteric liquid crystal layer having a visible light transmission region prepared using the same composition as the composition for preparing the polarization separation region, and having a selective reflection range in the ultraviolet light wavelength range or the infrared light wavelength range, Rth-Ch(X) and Rth-T(X) are substantially equal, and thus an intermediate value between the absolute value of Rth-Ch(X) and the absolute value of Rth-T(X) is also equal to these values. Therefore, the absolute value of Rth(X) in the positive C region is preferably equal to the absolute value of Rth-Ch(X) (and the absolute value of Rth-T(X)). This is because light leakage can be reduced most effectively with this configuration.

Further, in the image display device according to the embodiment of the present invention, when the polarization separation layer includes an optically isotropic visible light transmission region, it is preferable that the positive C region-containing layer includes in addition to the positive C region, an optically isotropic region corresponding to the visible light transmission region of the polarization separation layer. With such a configuration, the optical compensation can be performed only in a necessary region, and the effect of reducing light leakage and coloring at the time of oblique observation can be obtained without affecting the reflectivity and the like. At this time, the absolute value of Rth(X) in the positive C region is preferably equal to the absolute value of Rth-Ch(X). This is because light leakage can be reduced particularly effectively with this configuration. Further, particularly, when the polarization separation layer includes polarization separation sites arranged in the matrix form and the visible light transmission region is optically isotropic, correspondingly, in the positive C region-containing layer, the positive C region more preferably has a matrix form.

The film thickness of the positive C region-containing layer is preferably 0.3 to 3.0 μm, more preferably 0.5 to 2.8 μm, even more preferably 0.9 to 2.5 μm, and most preferably 1.0 to 1.5 μm.

In the positive C region, the liquid crystal compound has homeotropic alignment. The homeotropic alignment means a state in which the molecular long axis of the liquid crystal compound is aligned in a direction perpendicular to the film surface. The positive C region preferably exhibits a smectic phase or a nematic phase, and more preferably exhibits a smectic phase. In a case of a smectic phase, homeotropic alignment is easily attained to adopt a highly ordered layer structure in which the center positions of liquid crystal molecules are aligned, and even in a case where the alignment control force of the forming surface (base surface) of the substrate is weak, a liquid crystal layer having good homeotropic alignment can be obtained.

The positive C region preferably satisfies $-5 \leq Re(550) \leq 5$ ($|Re(550)| \leq 5$), and more preferably satisfies $-3 \leq Re(550) \leq 3$ ($|Re(550)| \leq 3$). The positive C region preferably satisfies $-250 \leq Rth(550) \leq -70$, and more preferably satisfies $-230 \leq Rth(550) \leq -130$.

[Positive C Region-Containing Layer Forming Composition]

The positive C region-containing layer includes a cured product of a positive C region-containing layer forming composition containing a liquid crystal compound C. In the present specification, the liquid crystal compound C indicates all liquid crystal compounds included in the positive C region-containing layer forming composition, and the composition may be formed of one liquid crystal compound or a mixture of two or more liquid crystal compounds.

The positive C region-containing layer forming composition includes the liquid crystal compound C, and further includes a polymerization initiator, a solvent and the like as necessary. The positive C region-containing layer forming composition preferably further includes a vertical alignment agent described later.

(Liquid Crystal Compound C)

As the liquid crystal compound C, a rod-like liquid crystal compound is preferable. The liquid crystal compound C is preferably a liquid crystal compound exhibiting a smectic phase or a nematic phase liquid crystal state, a liquid crystal compound exhibiting a nematic phase liquid crystal state may be used from the viewpoint of production conditions, and the like, and from the above viewpoint, a liquid crystal compound exhibiting a smectic liquid crystal state may be used.

As the liquid crystal compound C, any conventionally known liquid crystal compound may be used, and a liquid crystal compound similar to the liquid crystal compound used for forming the cholesteric liquid crystal layer may be used. The liquid crystal compound C preferably includes at least one compound selected from the group consisting of a compound represented by Formula (IA) and a compound represented by Formula (IIA).

preferably 50 to 98% by mass, and more preferably 70 to 95% by mass with respect to the total solid content.

(Vertical Alignment Agent)

The positive C region-containing layer forming composition preferably includes a vertical alignment agent. The vertical alignment agent is preferably a boronic acid compound and/or an onium salt. Specific examples of the boronic acid compound include compounds represented by the following formula.

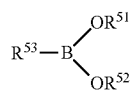

Formula (IA)

Formula (IIA)

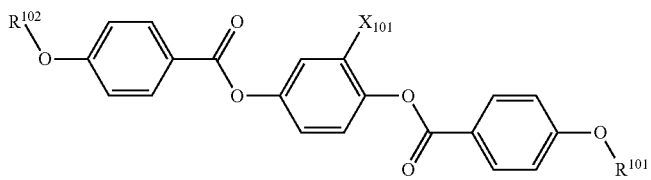

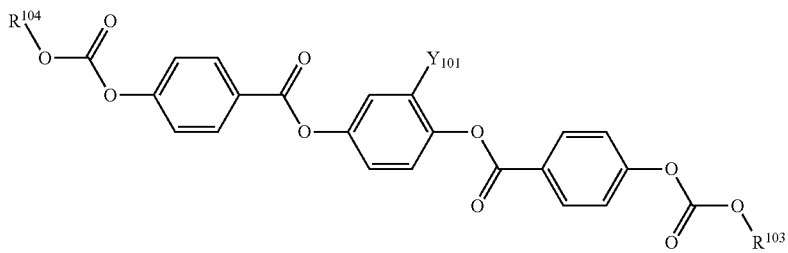

In Formulae (IA) and (IIA), $R^{101}$ to $R^{104}$ each independently represent —$(CH_2)_n$—OOC—CH=$CH_2$ and n represents an integer of 2 to 8. $X_{101}$ and $Y_{101}$ each independently represent a hydrogen atom or a methyl group. From the viewpoint of suppressing crystal precipitation, in Formula (IA) or (IIA), $X_{101}$ and $Y_{101}$ preferably represent a methyl group. From the viewpoint of exhibiting properties as a liquid crystal, n is preferably an integer of 4 to 8.

The amount of the liquid crystal compound C in the positive C region-containing layer forming composition is In the formula, $R^{51}$ and $R^{52}$ each independently represent a hydrogen atom, a substituted or unsubstituted aliphatic hydrocarbon group, an aryl group, or a heterocyclic group. $R^{53}$ represents a substituent including a functional group that can be bonded to a (meth)acryl group.

As a specific example of the boronic acid compound, a boronic acid compound represented by Formula (I) described in paragraph Nos. 0023 to 0032 of JP2008-225281A can be used. Further, boronic acid compounds shown below are also preferably used.

I-34)

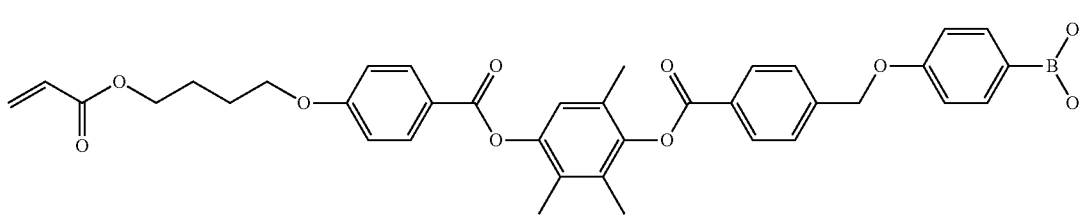

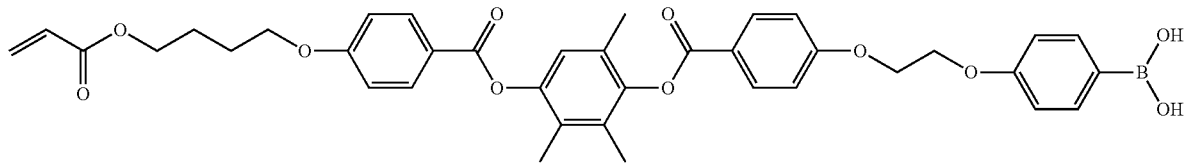

I-35)

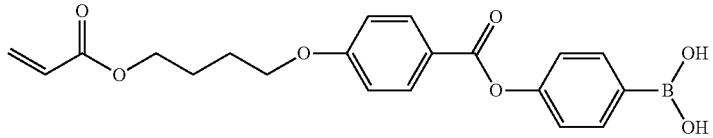

I-36)

Specific examples of the onium salt include compounds represented by the following formula.

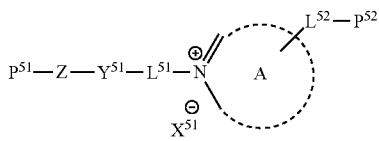

In the formula, a ring A represents a quaternary ammonium ion composed of a nitrogen-containing heterocycle, $X^{51}$ represents an anion; $L^{51}$ represents a divalent linking group; $L^{52}$ represents a single bond or a divalent linking group; $Y^{51}$ represents a divalent linking group having a 5- or 6-membered ring as a partial structure; Z represents a divalent linking group having 2 to 20 alkylene groups as a partial structure; and $P^{51}$ and $P^{52}$ each independently represent a monovalent substituent having a polymerizable ethylenically unsaturated group.

Specific examples of the onium salt include onium salts described in paragraph Nos. 0052 to 0058 of JP2012-208397A, onium salts described in paragraph Nos. 0024 to 0055 of JP2008-026730A, and JP2002-037777A.

The vertical alignment agent is preferably 0.1% to 5% by mass, more preferably 0.5% to 3% by mass with respect to the total mass of the liquid crystal compound included in the positive C region-containing layer forming composition. Only one vertical alignment agent may be included or two or more vertical alignment agents may be included. In a case where two or more vertical alignment are included, the total amount is set to be in the above range.

Further, the positive C region-containing layer forming composition may include a polymerization initiator, a non-liquid crystalline polymerizable compound, a solvent, other additives, and the like. The details regarding the liquid crystal composition used for forming the cholesteric liquid crystal layer can be referred to. However, it is preferable that the positive C region-containing layer forming composition does not include a chiral agent.

(Method of Producing Positive C Region-Containing Layer)

The positive C region-containing layer can be formed by applying the positive C-containing layer forming composition on the support or the alignment film surface provided on the support. The positive C region-containing layer can be produced by a known method.

For the formation of the positive C region-containing layer including an optically isotropic region, particularly, a positive C region-containing layer in which positive C regions and visible light transmission regions are arranged in the matrix form, the patterning method described above can be referred to. Such a positive C region-containing layer can be formed by, for example, heating the positive C region-containing layer forming composition pattern-exposed as described above to 50° C. or higher and 400° C. or lower, and preferably 80° C. or higher and 200° C. or lower, and making the unexposed portion optically isotropic.

[Circularly Polarizing Plate]

The circularly polarizing plate is provided on the image display side of the organic electroluminescent layer in the organic EL image display device for reducing the reflected glare of external light and improving the contrast. As the circularly polarizing plate, a known circularly polarizing plate as the circularly polarizing plate used in an organic EL image display device can be used.

The circularly polarizing plate includes a phase difference layer and a polarization layer. The circularly polarizing plate may have other layers such as an adhesive layer and a surface protective layer. In the image display device according to the embodiment of the present invention, the polarization separation layer, the phase difference layer and the polarization layer are arranged in this order in the circularly polarizing plate. The circularly polarizing plate may be formed of a phase difference layer and a polarization layer. The phase difference layer is preferably formed of a ¼ wavelength plate and the polarization layer is preferably formed of a linear polarizing plate.

(Polarization Layer)

The linear polarizing plate transmits specific linear polarized light among the light passing therethrough, and absorbs linear polarized light orthogonal thereto. As the linear polarizing plate, for example, a plate obtained by absorbing iodine in polyvinyl alcohol, performing stretching, and applying a protective layer of triacetylcellulose on both sides of a film having a polarization function, or a plate obtained by adding metal nanorods of Ag or the like, to polyvinyl alcohol and performing stretching can be used.

(Phase Difference Layer)

The phase difference layer in the circularly polarizing plate used in the organic EL image display device may be a phase difference layer having a function as a ¼ wavelength plate in the visible light region. In the present specification, the ¼ wavelength plate is also referred to as a λ/4 plate. Examples of the ¼ wavelength plate include a single layer ¼ wavelength plate, and a broadband ¼ wavelength plate in which a ¼ wavelength plate and a ½ wavelength phase difference plate are laminated, and these plates can be suitably used.

The front retardation of the former ¼ wavelength plate may be a length that is ¼ of the light emission wavelength of the image display device. Therefore, for example, in a case where the light emission wavelength of the image display device is 450 nm, 530 nm, and 640 nm, as the ¼ wavelength plate, a phase difference layer of reverse wavelength dispersion is most preferable which results in a phase difference of 112.5 nm±10 nm, preferably 112.5 nm±5 nm, and more preferably 112.5 nm at a wavelength of 450 nm, a phase difference of 132.5 nm±10 nm, preferably 132.5 nm±5 nm, and more preferably 132.5 nm at a wavelength of 530 nm, and a phase difference of 160 nm±10 nm, preferably 160 nm±5 nm, and more preferably 160 nm at a wavelength of 640 nm. As the ¼ wavelength plate, it is also possible to use a phase difference plate having low front retardation wavelength dispersion and a phase difference plate having forward wavelength dispersion. The reverse wavelength dispersion means properties in which the longer the wavelength is, the larger the absolute value of the front retardation becomes, and the forward wavelength dispersion means properties in which the shorter the wavelength is, the greater the absolute value of the front retardation becomes.

In a laminate type ¼ wavelength plate, a ¼ wavelength plate and a ½ wavelength phase difference plate are laminated such that the slow axes thereof intersect at an angle of 60° C., the ½ wavelength phase difference plate side is arranged on a linearly polarized light incident side, and the laminate type ¼ wavelength plate is used in a state where the slow axis of the ½ wavelength phase difference plate intersects the polarization surface of the incident linearly polarized light at 15° or 75°. Accordingly, excellent phase difference reverse wavelength dispersion is exhibited, and thus the laminate type ¼ wavelength plate can be suitably used.

The ¼ wavelength plate is not particularly limited and can be appropriately selected according to the purpose. Examples thereof include a quartz plate, a stretched polycarbonate film, a stretched norbornene polymer film, a transparent film in which inorganic particles exhibiting birefringence, such as strontium carbonate, are contained and aligned, a thin film formed by oblique deposition of an inorganic dielectric on a support, or a film formed by applying a liquid crystal composition to a support or an alignment film, after forming the polymerizable liquid crystal compound in the liquid crystal composition into a nematic alignment in the liquid crystal state, and immobilizing the liquid crystal compound by photocrosslinking or thermal crosslinking.

Examples of the ¼ wavelength plate include (1) phase difference plate described in JP1993-027118A (JP-H05-027118A) and JP1993-027119A (JP-H05-027119A) that is obtained by laminating a birefringent film having a large front retardation and a birefringent film having a small front retardation such that the optical axes of the films become orthogonal to each other, (2) phase difference plate described in JP1998-068816A (JP-H10-068816A) that is prepared by laminating a polymer film, which results in a λ/4 wavelength at a specific wavelength, and a polymer film, which is formed of the same material as that of the polymer film and results in a λ/2 wavelength at the same wavelength, so as to obtain a λ/4 wavelength in a wide wavelength range, (3) phase difference plate described in JP1998-090521A (JP-H10-90521A) that can accomplish a λ/4 wavelength in a wide wavelength range by the lamination of two sheets of polymer films, (4) phase difference plate described in WO00/026705A that can accomplish a λ/4 wavelength in a wide wavelength range by using a modified polycarbonate film, (5) phase difference plate described in WO00/065384A that can accomplish a λ/4 wavelength in a wide wavelength range by using a cellulose acetate film, and the like.

As the ¼ wavelength plate, commercially available products can also be used. Examples of the commercially available products include PLUREACE (registered trademark) WR (polycarbonate film manufactured by TEJIN LIMITED).

The ¼ wavelength plate may be formed by aligning and immobilizing a polymerizable liquid crystal compound and a polymer liquid crystal compound. For example, the ¼ wavelength plate can be formed by applying a liquid crystal composition to a support or an alignment film, forming a nematic alignment of the polymerizable liquid crystal compound in the liquid crystal composition in a liquid crystal state, and then immobilizing the alignment state by means of photocrosslinking or thermal crosslinking. The ¼ wavelength plate may also be a layer obtained by applying a composition including a liquid crystal compound to a support or an alignment film surface, forming a nematic alignment in a liquid crystal state, and then immobilizing the alignment state by cooling.

As the polymerizable liquid crystal compound for forming the ¼ wavelength plate, the rod-like liquid crystal compound the same as the rod-like liquid crystal compound used in the preparation of the positive C region-containing layer, or a disk-like liquid crystal compound described in WO2014/073616 can be used.

The ¼ wavelength plate also preferably includes an A-plate in which the liquid crystal compound has a homogeneous alignment. The homogeneous alignment means a state in which the molecular long axis of the liquid crystal compound is aligned with respect to the film surface in the horizontal direction. A positive A-plate preferably exhibits a smectic phase. Note that in this specification, the smectic phase refers to a state in which molecules aligned in one direction have a layer structure. The nematic phase refers to a state in which the constituent molecules have an alignment order but do not have a three-dimensional positional order. It is also preferable to use a reverse wavelength dispersion A-plate as the single layer type ¼ wavelength plate.

[Light Emitting Element Substrate]

The light emitting element substrate includes at least a reflecting layer and an organic electroluminescent layer. Usually, a light emitting element substrate may include a reflecting layer and an organic electroluminescent layer on a TFT substrate having a pixel structure which is formed by a thin film transistor (TFT) on a surface of glass or the like. The organic electroluminescent layer is typically is preferably contained as the organic electroluminescent layer group arranged in the matrix form on the TFT substrate.

In a monochromatic light emitting image display device, any of organic electroluminescent layers included in the organic electroluminescent layer group may emit light of the same wavelength. On the other hand, usually, the organic electroluminescent layer group preferably includes organic electroluminescent layers that emit light of different wavelengths, and more preferably includes two or more organic electroluminescent layers, particularly three or more organic electroluminescent layers. The organic electroluminescent layer group preferably includes an organic electroluminescent layer for red light emission, an organic electroluminescent layer for green light emission, and an organic electroluminescent layer for blue light emission.

The organic electroluminescent layer means a layer that has at least a light emitting layer and may further include each layer such as a hole transport layer, an electron transport layer, a hole block layer, an electron block layer, a hole injection layer, and an electron injection layer as functional layers other than the light emitting layer. The organic electroluminescent layer may be an organic electroluminescent layer of a microcavity structure described in JP2016-139372A.

In the light emitting element substrate, when the TFT substrate, the reflecting layer and the organic electroluminescent layer are arranged in this order, the image display device is of a top emission type and can extracts light to display an image. In the light emitting element substrate, when the TFT substrate, the reflecting layer and the organic electroluminescent layer are arranged in this order, the image display device is of a bottom emission type and can extract light to display an image. The image display device according to the embodiment of the present invention may of a bottom emission type or a top emission type, and is preferably of a top emission type.

The reflecting layer may be, for example, a reflective electrode. As the reflective electrode, an aluminum electrode that is generally used in an organic light emitting device can be used. The light emitting element substrate further includes a transparent electrode such as indium tin oxide (ITO) electrode. Examples of the layer structure of the light emitting element substrate include the following.

TFT substrate/reflective electrode/organic electroluminescent layer/transparent electrode TFT substrate/transparent electrode/organic electroluminescent layer/reflective electrode The light emitting element substrate may further include a barrier layer for sealing the organic electroluminescent layer, and a light extraction layer.

With respect to the organic electroluminescent layer, each layer in the organic electroluminescent layer, preparing materials and configurations of the transparent electrode and the reflective electrode, the lamination order, and the configuration of the light emitting element substrate, the descriptions in paragraphs 0081 to 0122 of JP2012-155177A, JP4011292B, and JP2016-139372A can be referred to.

[Adhesive Layer]

The image display device according to the embodiment of the present invention may include an adhesive layer for bonding the layers. As the adhesive or pressure sensitive adhesive used for forming the adhesive layer, from the viewpoint of the curing method, there are a hot melt type, a thermosetting type, a photocuring type, a reaction curing type, and a pressure sensitive adhesive type without curing. As respective materials, acrylate-based, urethane-based, urethaneacrylate-based, epoxy-based, epoxy acrylate-based, polyolefin-based, modified olefin-based, polypropylene-based, ethylenevinyl alcohol-based, vinyl chloride-based, chloroprene rubber-based, cyanoacrylate-based, polyamide-based, polyimide-based, polystyrene-based, and polyvinyl butyral-based compounds, or the like can be used. In the viewpoint of workability and productivity, a photocuring type is preferable as a curing type and an ultraviolet curing type is particularly preferable. In the viewpoint of optical transparency and heat resistance, acrylate-based, urethaneacrylate-based, epoxy acrylate-based compounds, or the like are preferably used as the material.

The adhesive layer may be a highly transparent adhesive transfer tape (OCA tape). Particularly, an OCA tape is preferably used for bonding the organic electroluminescent element substrate and a film (a laminate including a polarization separation layer) provided thereon. As the high transparency adhesive transfer tape, a commercially available product for an image display device, particularly, a commercially available product for the surface of an image display unit of an image display device may be used. Examples of commercially available products include pressure-sensitive adhesive sheets (PD-S1 and the like) manufactured by PANAC CO., LTD., and pressure-sensitive adhesive sheets of MHM series manufactured by NICHIEI KAKOH CO., LTD.

The thickness of the adhesive layer is preferably 0.1 μm to 10 μm, and more preferably 0.5 μm to 5.0 μm.

<Method of Preparing Organic EL Image Display Device>

The organic EL image display device may be produced by providing a positive C region-containing layer and a polarization separation layer on a light emitting element substrate in either order, and bonding a circularly polarizing plate separately formed thereon to the surface of a phase difference layer, or may be prepared by providing a positive C region-containing layer and a polarization separation layer on a phase difference layer side of a circularly polarizing plate in either order, and bonding the surface to a light emitting element substrate. Either one of the positive C region-containing layer and the polarization separation layer may be provided on the light emitting element substrate, the other may be provided on the circularly polarizing plate, and then both may be bonded. When using a light emitting element substrate including an organic electroluminescent layer group in which organic electroluminescent layers are arranged in a matrix form on a reflecting layer, it is preferable to use a polarization separation layer in which polarization separation sites are arranged in a matrix form corresponding to the organic electroluminescent layer. The organic electroluminescent layer group and the polarization separation region may be laminated and bonded by performing alignment such that each organic electroluminescent layer and polarization separation site correspond to each other. Further, in a case where a positive C region-containing layer in which positive C regions are arranged in a matrix form corresponding to the polarization separation layer including polarization separation sites arranged in a matrix form, the organic electroluminescent layer group and the polarization separation region may be laminated and bonded by performing alignment such that each polarization separation site and positive C region correspond to each other.

When the organic electroluminescent layer group includes an organic electroluminescent layer that emits light of two or more wavelengths, a polarization separation layer in which polarization separation sites are arranged may be prepared and bonded such that each polarization separation site corresponding to each organic electroluminescent layer reflects the light of one polarization state in the wavelength range of light emitted from the organic electroluminescent layers arranged at each of the corresponding positions.

Examples

Hereinafter, the present invention is described in detail with reference to examples. Materials, reagents, material amounts, and ratios thereof, operations, or the like shown in the examples below can be appropriately changed without departing from the gist of the invention. Accordingly, the scope of the invention is not limited to the examples below.

In the examples, the light emission range of the organic electroluminescent layer indicated by a numerical value means a half-width of the light emission spectrum peak of the organic electroluminescent layer.

In the examples, SK-2057 (manufactured by Soken Chemical Co., Ltd.) was used as a pressure sensitive adhesive.

<Preparation of Image Display Device for Evaluation>
[Preparation of Light Emitting Element Substrate]

A commercially available organic EL image display device (SC-04E manufactured by Samsung Electronics Co., Ltd.) including a blue organic electroluminescent layer, a green organic electroluminescent layer, and a red organic electroluminescent layer was prepared. A device in which the polarizing plate and the optical film were peeled off from the organic EL image display device, and the surface of the barrier layer for protecting a light emitting element was exposed was used as a light emitting element substrate.

Figure 4:
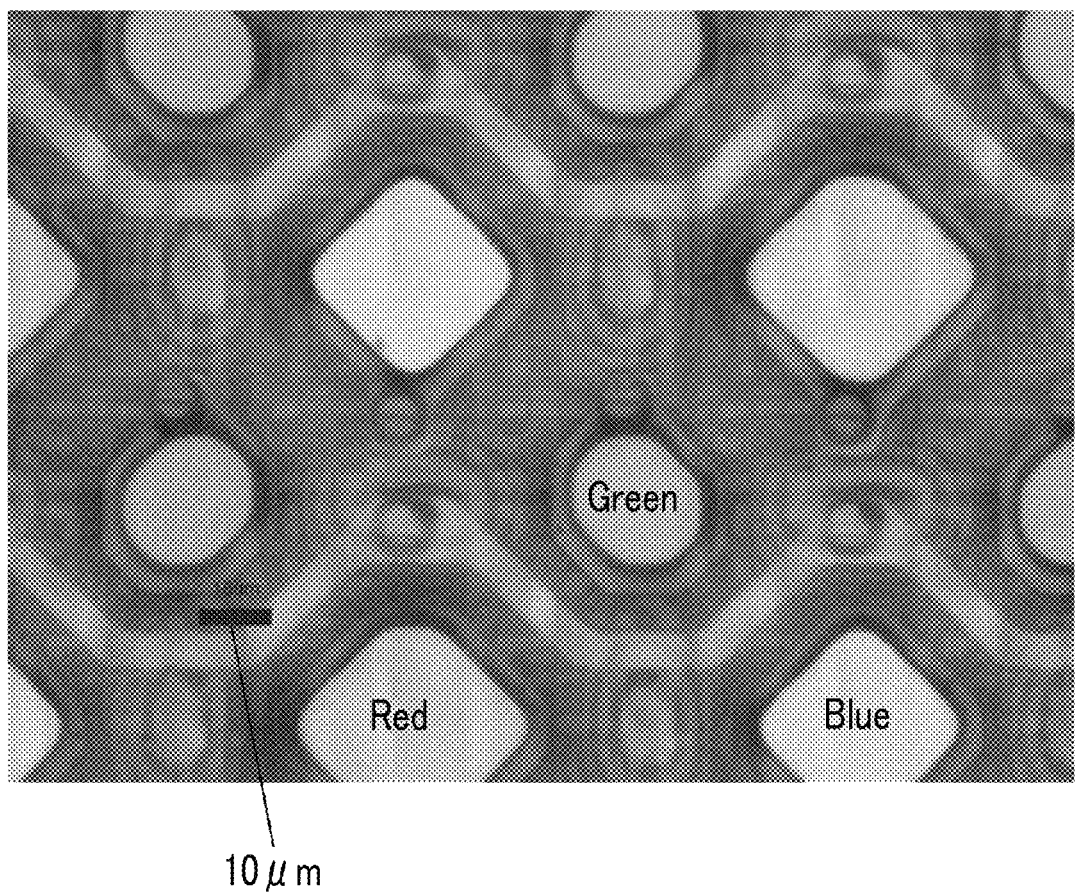
FIG. 4 is a view showing the arrangement of a blue organic electroluminescent layer (Blue), a green organic electroluminescent layer (Green), and a red organic electroluminescent layer (Red) in an SC-04E light emitting element substrate.

The light emission spectrum of the blue organic electroluminescent layer of the light emitting element substrate used had a center wavelength of 450 nm and a light emission range of 40 nm, the light emission spectrum of the green organic electroluminescent layer had a center wavelength of 550 nm and a light emission range of 45 nm, and the spectrum of the red organic electroluminescent layer wad a center wavelength of 650 nm and a light emission range of 50 nm. The arrangement of the blue organic electroluminescent layer (Blue), the green organic electroluminescent layer (Green), and the red organic electroluminescent layer (Red) in the light emitting element substrate is as shown in FIG. 4.

[Preparation of Each Layer Preparing Composition]
(Preparation of Alignment Film Composition A)

The mixture of each component shown below was stirred and dissolved in a container kept at 80° C. and an alignment film composition A was prepared.

| Alignment Film Composition A (parts by mass) | |
|---|---|
| Pure water | 97.2 |
| PVA-103 (polyvinyl alcohol, manufactured by Kuraray Co. Ltd.) | 2.8 |

(Preparation of Cholesteric Composition LC-1)

The following respective components were mixed and then filtered through a polypropylene filter having a pore size of 0.2 μm, and the obtained material was used as a cholesteric composition LC-1.

| Cholesteric Composition LC-1 (parts by mass) | |
|---|---|
| Rod-like liquid crystal compound (L-1) | 100 |
| Photoreactive right-turning chiral agent (C-1) | 6.00 |
| Horizontal alignment agent (L-2) | 0.1 |
| Polymerization initiator IRGACURE 819 (manufactured by BASF SE) | 4.0 |
| Polymerization control agent IRGANOX 1010 (manufactured by BASF SE) | 1.0 |
| Solvent (Chloroform) | 330.3 |

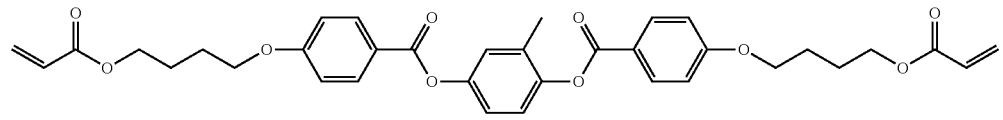

84%

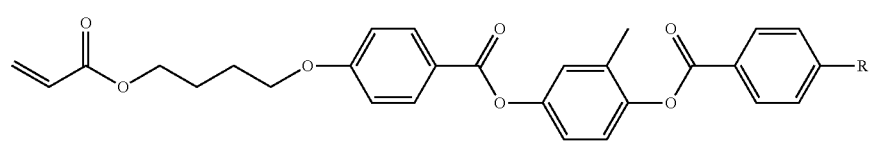

14%

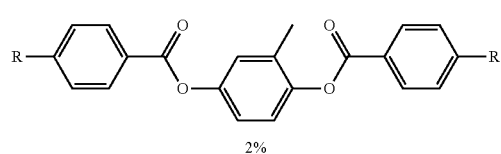

2%

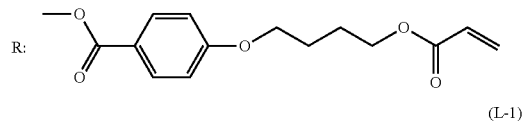

(L-1)

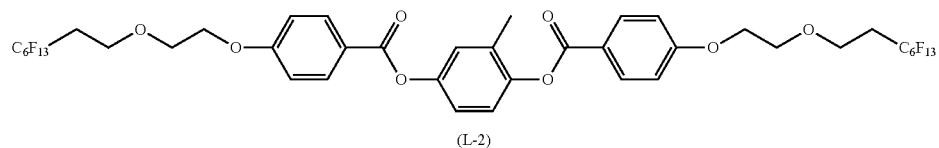

(L-2)

| Cholesteric Composition LC-1 (parts by mass) |
| --- |

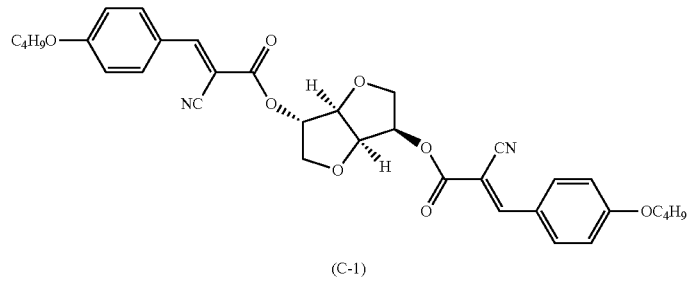

(C-1)

(Preparation of Cholesteric Composition LC-2)

The following respective components were mixed and then filtered through a polypropylene filter having a pore size of 0.2 μm, and the obtained material was used as a cholesteric composition LC-2.

| Cholesteric Composition LC-2 (parts by mass) | |
| --- | --- |
| Rod-like liquid crystal compound (L-1) | 19.57 |
| Horizontal alignment agent (L-2) | 0.015 |
| Chiral agent (C-2) | 1.49 |
| Polymerization initiator (IRGACURE 907, manufactured by BASF SE) | 0.587 |
| Photosensitizer (KAYACURE DETX-S, manufactured by Nippon Kayaku Co., Ltd.) | 0.916 |
| Polymerization control agent (IRGANOX 1076, manufactured by BASF SE) | 0.078 |
| Methyl ethyl ketone | 80.0 |

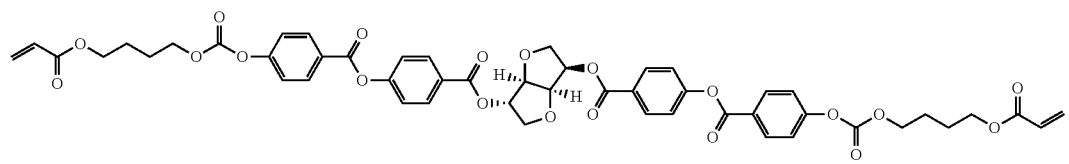

(C-2)

(Preparation of Liquid Crystal Composition LC-3 for Positive C Region-Containing Layer)

The following respective components were mixed and then filtered through a polypropylene filter having a pore size of 0.2 μm, and the obtained material was used as a liquid crystal composition LC-3.

| Liquid Crystal Composition LC-3 (parts by mass) | |
| --- | --- |
| Rod-like liquid crystal compound (L-1) | 100 |
| Leveling agent (T-1) | 0.4 |
| Leveling agent (T-2) | 0.2 |
| Compound (L-3) | 1.0 |
| Compound (L-4) | 2.5 |
| Polymerization initiator (IRGACURE 907, manufactured by BASF SE) | 0.587 |
| Photosensitizer (KAYACURE DETX-S, manufactured by Nippon Kayaku Co., Ltd.) | 0.916 |
| Polymerization control agent (IRGANOX 1076, manufactured by BASF SE) | 0.078 |
| Solvent (methyl ethyl ketone) | 330.3 |

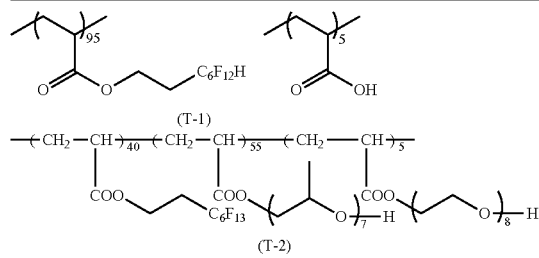

(T-1)

(T-2)

Liquid Crystal Composition LC-3 (parts by mass)

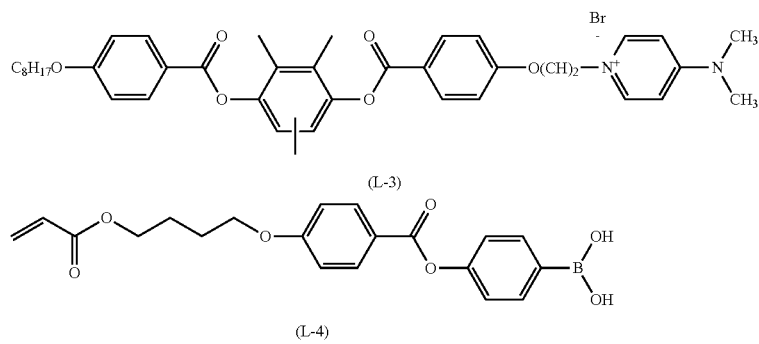

(L-3)

(L-4)

[Production of Image Display Device for Evaluation]

Comparative Example 1

A polarizer prepared by the procedure shown in Example 1 of WO2016/194801, an optically anisotropic layer A (λ/2 plate), and an optically anisotropic layer B (λ/4 plate) were arranged in the order of polarizer, optically anisotropic layer A (λ/2 plate), and optically anisotropic layer B (λ/4 plate) to prepare a circularly polarizing plate CP1. In the observation from the polarizer side, when the counterclockwise direction was expressed as a positive value with the transmission axis of the polarizer as the reference (0°), the angle of the slow axis of the λ/2 plate was −72.5° and the angle of the slow axis of the α/4 plate was −12.5°. Subsequently, the surface of the barrier layer of the light emitting element substrate and the optically anisotropic layer B of CP1 were bonded together using a pressure sensitive adhesive to prepare an image display device for evaluation.

Comparative Example 2

Figure 3:
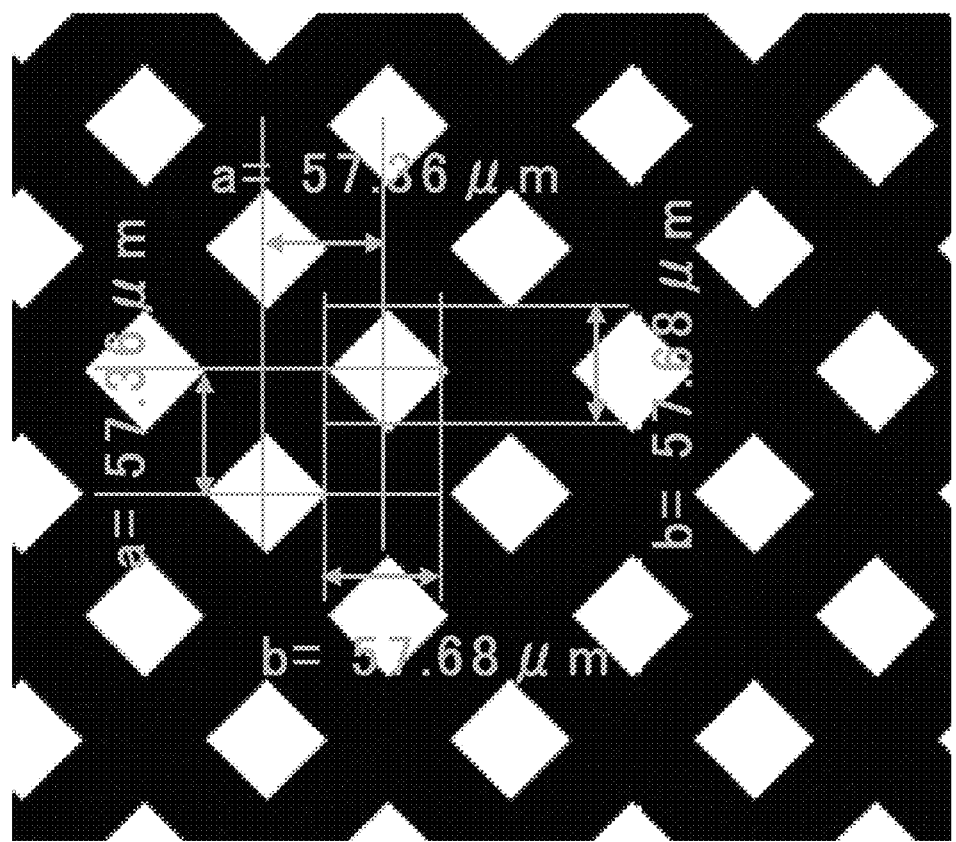
FIG. 3 is a view showing a transmission portion (white) and a shielding portion (black) of a photomask A used in Examples.

The alignment film composition A was uniformly applied to a glass substrate having a thickness of 0.5 mm (Eagle XG, manufactured by Corning Incorporated) using a slit coater, and then dried in an oven at 100° C. for 2 minutes to obtain a glass substrate A with an alignment film having a film thickness of 0.5 μm. The alignment film was subjected to a rubbing treatment in a direction parallel to the coating direction. The cholesteric composition LC-1 was spin-coated on the rubbed surface so that the dry film thickness was 1.25 μm. After the glass substrate with an alignment film on which the coating film was arranged was heated on a hot plate at 80° C. for 1 minute to remove the solvent by drying and a cholesteric alignment state was formed, the coating film was irradiated with ultraviolet (UV) light with an irradiance of 30 mW/cm² for 10 seconds at room temperature in a nitrogen atmosphere through the photomask A shown in FIG. 3 using an EXECURE 3000-W manufactured by HOYA-SCHOTT to immobilize the alignment of the exposed portion (corresponding to the transmission portion) (A). In FIG. 3, white is a transmission portion, and black is a shielding portion. Next, after the photomask was removed and the substrate was irradiated with UV light with an irradiance of 3 mW/cm² for 8 seconds under air, and the coating film was heated on a hot plate at 80° C. for 1 minute to convert the reflection wavelength of the non-immobilized portion to the long wavelength side. Thereafter, the coating film was irradiated with UV light with an irradiance of 30 mW/cm² again for 10 seconds at room temperature in a nitrogen atmosphere to immobilize the alignment of the remaining portion (corresponding to the shielding portion) (B). Thus, a layer having a cholesteric liquid crystal layer pattern was prepared. The reflection center wavelength in the exposed portion was 350 nm or less, and the reflection center wavelength in the remaining portion B was 450 nm. The Rth(550) was 150 nm in all cases.

The surface of the optically anisotropic layer B side of the same circularly polarizing plate CP1 as in Comparative Example 1 was bonded to the glass substrate side of the laminate including the obtained layer having the cholesteric liquid crystal layer pattern to prepare a laminate. The side of the obtained layer having the cholesteric liquid crystal layer pattern and the barrier layer of the light emitting element substrate were laminated using a pressure sensitive adhesive such that the center of a blue organic electroluminescent layer shown in FIG. 4 matched the center of the cholesteric liquid crystal layer (individual exposed portions) and thus an image display device for evaluation was prepared.

Example 1

<Preparation of Positive C Region-Containing Layer>

Pellets of a mixture (Tg: 127° C.) of 90 parts by mass of an acrylic resin having a lactone ring structure represented by Formula (II) {mass ratio of copolymerizable monomer=methyl methacrylate/2-(hydroxymethyl)methyl acrylate=8/2, a lactone ring formation rate: about 100%, a content ratio of the lactone ring structure: 19.4%, a weight-average molecular weight: 133000, a melt flow rate: 6.5 g/10 min (240° C., 98N (10 kgf)), Tg: 131° C.}, and 10 parts by mass of an acrylonitrile-styrene (AS) resin {TOYO AS AS20, manufactured by TOYO STYRENE Co., Ltd.} were supplied to a twin screw extruder, and melted and extruded in a sheet form at about 280° C. Thereafter, the melted and extruded sheet was longitudinally stretched in a longitudinal uniaxial stretching machine at an air supply temperature of 130° C., a sheet surface temperature of 120° C., a stretching speed of 30%/min, and a stretching ratio of 35%. Thereafter, the longitudinally stretched sheet was stretched in a tenter type stretching machine at an air supply temperature of 130° C., a sheet surface temperature of 120° C., a stretching speed of 30%/min, and a stretching ratio of 35%. Thereafter, the laterally stretched sheet was cut off at both ends in front of a winding portion and wound up as a roll film having a length of 4000 m to obtain a long support having a thickness of 40 μm.

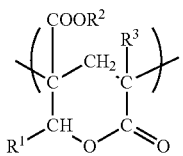 (II)

In Formula (II), $R^1$ represents a hydrogen atom, and $R^2$ and $R^3$ each represents a methyl group.

The alignment film composition A was uniformly applied to the support using a bar coater, and then dried in an oven at 100° C. for 2 minutes to obtain a support with an alignment film having a thickness of 0.5 μm. The liquid crystal composition LC-3 was applied to the alignment film using a bar coater so that the dry film thickness was 1.25 μm. Next, the coating film was heated and aged for 60 seconds at a film surface temperature of 95° C. Immediately after the heating and aging, exposure was performed at an exposure dose of 500 mJ/cm² using a PLA-501F exposure machine (super high pressure mercury lamp) manufactured by Canon Inc. under air at 25° C., and thus a laminate including a positive C region-containing layer where the Rth(550) was −150 nm was obtained.

The surface of the positive C region-containing layer was bonded to the optically anisotropic layer side of the circularly polarizing plate CP1 using a pressure sensitive adhesive, subsequently, the support was peeled off, and only the positive C region-containing layer was transferred. The glass substrate side of a laminate including a layer having a cholesteric liquid crystal layer pattern prepared in the same method as in Comparative Example 2 was laminated on the surface of the positive C region-containing layer using a pressure sensitive adhesive. Thereafter, the obtained laminate was laminated on the light emitting element substrate in the same procedure as in Comparative Example 2 to prepare an image display device for evaluation.

Example 2

An image display device for evaluation was prepared in the same manner as in Example 1 except that the thickness of the layer having a cholesteric liquid crystal layer pattern was set to 2.08 μm, the Rth(550) was set to 250 nm, and the Rth(550) of the positive C region-containing layer was set to −250 nm by changing the thickness of the coating layer.

Example 3

An image display device for evaluation was prepared in the same manner as in Example 1 except that the Rth(550) was set to 70 nm by setting the thickness of the layer having a cholesteric liquid crystal layer pattern to 0.58 μm, and the Rth(550) of the positive C region-containing layer was set to −70 nm by changing the thickness of the coating layer.

Comparative Example 3

A laminate having a cholesteric liquid crystal layer (having no pattern) having a reflection center wavelength of 450 nm on the entire surface instead of the layer having a cholesteric liquid crystal layer pattern was prepared in the same procedure as in Comparative Example 2 except that a photomask was not used. An image display device for evaluation was prepared in the same manner as in Example 1 except that the obtained laminate was used instead of the laminate including a layer having a cholesteric liquid crystal layer pattern.

Example 4

The positive C region-containing layer prepared in the same manner as in Example 1 was laminated on the side of the layer having a cholesteric liquid crystal layer pattern of the laminate having the layer having a cholesteric liquid crystal layer pattern and the circularly polarizing plate prepared in Comparative Example 2 using a pressure sensitive adhesive, subsequently, the support was peeled off, and only the positive C region-containing layer was transferred. The obtained polarizing plate was laminated on the light emitting element substrate in the same manner as in Comparative Example 2 to prepare an image display device for evaluation.

Example 5

The glass substrate A with alignment film was subjected to a rubbing treatment, and the cholesteric composition LC-2 was applied to the substrate by spin coating so that the dry film thickness was 1.25 μm. Next, the coating film was heated and aged for 60 seconds at a film surface temperature of 95° C. Immediately after the heating and aging, exposure was performed under air at 25° C. using a PLA-501F exposure machine (super high pressure mercury lamp) manufactured by Canon Inc. at an exposure dose of 100 mJ/cm² through a photomask B in which the shielding portion and the transmission portion of the photomask A were inverted. Thereafter, by performing exposure under nitrogen using an air cooled metal halide lamp (manufactured by Eye Graphics Co., Ltd.) at an exposure dose of 500 mJ/cm² while heating the entire substrate to 200° C., a layer having a cholesteric liquid crystal layer pattern divided into a region with cholesteric reflection (C) having a reflection center wavelength of 450 nm, a reflection range of 89 nm, and an Rth(550) of 150 nm, and an optically isotropic region (D) was obtained. The obtained laminate including the layer having a cholesteric liquid crystal layer pattern was laminated on the circularly polarizing plate, the positive C region-containing layer, and the light emitting element substrate in the same manner as in Example 3 to prepare an image display device for evaluation.

Example 6

The glass substrate A with alignment film was subjected to a rubbing treatment, and the cholesteric composition LC-2 was applied to the substrate by spin coating so that the dry film thickness was 1.25 μm. Next, the coating film was heated and aged for 60 seconds at a film surface temperature of 95° C. Immediately after the heating and aging, exposure was performed under air at 25° C. using a PLA-501F exposure machine (super high pressure mercury lamp) manufactured by Canon Inc. at an exposure dose of 100 mJ/cm² through a photomask B in which the shielding portion and the transmission portion of the photomask A were inverted. Thereafter, by performing exposure under nitrogen using an air cooled metal halide lamp (manufactured by Eye Graphics Co., Ltd.) at an exposure dose of 500 mJ/cm² a while heating the entire substrate to 200° C., a layer having a cholesteric liquid crystal layer pattern divided into a region with cholesteric reflection (C) having a reflection center wavelength of 450 nm, a reflection range of 89 nm, and an Rth(550) of 150 nm, and an optically isotropic region (D) was obtained. The obtained laminate including the layer having a cholesteric liquid crystal layer pattern was laminated on the circularly polarizing plate, the positive C region-containing layer, and the light emitting element substrate in the same manner as in Example 1 to prepare an image display device for evaluation.

Example 7

<Preparation of Positive C Region-Containing Layer Having Optically Isotropic Region>

The alignment film composition A was uniformly applied to the support using a bar coater, and then dried in an oven at 100° C. for 2 minutes to obtain a support with an alignment film having a thickness of 0.5 µm. The liquid crystal composition LC-3 was applied to the alignment film using a bar coater so that the dry film thickness was 1.25 µm. Next, the coating film was heated and aged for 60 seconds at a film surface temperature of 95° C. Immediately after the heating and aging, exposure was performed under air at 25° C. using a PLA-501F exposure machine (super high pressure mercury lamp) manufactured by Canon Inc. at an exposure dose of 100 mJ/cm² through the photomask B. Thereafter, by performing exposure under nitrogen using an air cooled metal halide lamp (manufactured by Eye Graphics Co., Ltd.) at an exposure dose of 500 mJ/cm² a while heating the entire substrate to 200° C., a laminate including a positive C region-containing layer having an optically isotropic region divided into a vertical alignment region (E) where the Rth(550) was −150 nm, and an optically isotropic region (D) was obtained. An image display device for evaluation was prepared in the same procedure as in Example 1 except that lamination was performed using this positive C region-containing layer so that the region (C) of the patterned cholesteric sample and the region (E) of the patterned vertical alignment sample were overlapped with each other.

Comparative Example 4

A positive A-plate and a positive C-plate (positive C region-containing layer) prepared by the method shown in Example 32 of JP2015-200861A were laminated on the same polarizer as that used in Comparative Example 1 such that the polarizer, the positive A-plate, and the positive C-plate were laminated in this order, and thus a circularly polarizing plate X2 was prepared. The slow axis of the positive A-plate was set to 45° with respect to the transmission axis of the polarizer. The positive A-plate had an Re(550) of 138 nm and an Rth(550) of 69 nm, and Re(450)/Re(550) was 0.86. The positive C-plate had an Re(550) of 0 nm and an Rth(550) of −60 nm, and Rth(450)/Rth(550) was 1.05.

Example 8

A circularly polarizing plate X3 was prepared in the same manner as in Comparative Example 4 except that the Rth (550) of the positive C-plate (positive C region-containing layer) was changed to −210 nm by changing the thickness of the coating layer. Next, the glass substrate side of a laminate including a layer having a cholesteric liquid crystal layer pattern prepared in the same manner as in Example 1 was laminated on the surface of the positive C-plate using a pressure sensitive adhesive, and the obtained laminated optical body was laminated on the light emitting element substrate in the same procedure as in Comparative Example 2. Thus, an image display device for evaluation was prepared.

[Evaluation of Image Display Device for Evaluation]

(Light Emission Brightness Evaluation)

The panel for evaluation was turned on to display monochromatic blue on the entire surface, then placed on a stand, and a spectral radiometer SR-3 (manufactured by Topcon Co., Ltd.) was placed 2 m ahead to evaluate the brightness. With respect to the brightness of the image display device without the cholesteric material of Comparative Example 1, the improvement rate of the brightness of the image display device of each Example and Comparative Example was evaluated.

A: The brightness improvement rate was 40% or higher.

B: The brightness improvement rate was lower than 40% and 20% or higher.

C: The brightness improvement rate was lower than 20% and 5% or higher.

D: The brightness improvement rate was lower than 5%.

(Evaluation of Light Leakage at the Time of Oblique Observation)

Light leakage at the time of oblique observation was evaluated according to the following standards by using a Y value obtained by measuring the laminate from an 8-degree direction in the normal direction using an SCE mode of colorimeter (CM-2022, manufactured by Konica Minolta Holdings, Inc.), and setting a difference with the Y value of Comparative Example 2 to ΔY.

A: A case where ΔY is 20% or less of ΔY of Comparative Example 2

B: A case where ΔY is more than 20% and 40% or less of ΔY of Comparative Example 2

C: A case where ΔY is more than 40% and 60% or less of ΔY of Comparative Example 2

D: A case where ΔY is more than 60% of ΔY of Comparative Example 2

(Blurring Evaluation)

The image display device for evaluation was turned on, blue and black stripes were displayed by repeating 2 pixels of blue and 5 pixels of black, and the presence or absence of blurring was visually evaluated.

TABLE 1

| | Circularly polarizing plate Phase difference type | Polarization separation layer | | | | Positive C region-containing layer | | | Evaluation | | |
|---|---|---|---|---|---|---|---|---|---|---|---|
| | | Polarization separation region | | Visible light transmission region | | | | Brightness improvement rate | Light leakage at the time of oblique observation | Blurring |
| | | Alignment state | Rth | Alignment state | Rth | Thickness | Rth | Optically isotropic region | | | |
| Comparative Example 1 | Two-piece type | — | — | — | — | — | — | — | D | A | Not visually recognized |
| Comparative Example 2 | Two-piece type | B-Ch | 150 | UV-Ch | 150 | 1.25 | — | — | A | D | Not visually recognized |
| Example 1 | Two-piece type | B-Ch | 150 | UV-Ch | 150 | 1.25 | -150 | None | A | A | Not visually recognized |
| Example 2 | Two-piece type | B-Ch | 250 | UV-Ch | 250 | 2.08 | -250 | None | A | B | Not visually recognized |
| Example 3 | Two-piece type | B-Ch | 70 | UV-Ch | 70 | 0.58 | -70 | None | B | A | Not visually recognized |
| Comparative Example 3 | Two-piece type | B-Ch | 150 | — | — | 1.25 | -150 | None | A | C | Visually recognized |
| Example 4 | Two-piece type | B-Ch | 150 | UV-Ch | 150 | 1.25 | -150 | None | A | A | Not visually recognized |
| Example 5 | Two-piece type | B-Ch | 150 | Isotropic | 0 | 1.25 | -70 | None | A | B | Not visually recognized |
| Example 6 | Two-piece type | B-Ch | 150 | Isotropic | 0 | 1.25 | -150 | None | A | C | Not visually recognized |
| Example 7 | Two-piece type | B-Ch | 150 | Isotropic | 0 | 1.25 | -150 | Provided | A | A | Not visually recognized |
| Comparative Example 4 | Reverse dispersion + A | — | — | — | — | — | -60 | None | D | A | Not visually recognized |
| Example 8 | Reverse dispersion + A | B-Ch | 150 | UV-Ch | 150 | 1.25 | -210 | None | A | A | Not visually recognized |

EXPLANATION OF REFERENCES

1: polarization separation layer
2: organic electroluminescent layer
3: reflecting layer
4: light emitting element substrate
5: phase difference layer
6: polarization layer
7: circularly polarizing plate
8: polarization separation region (polarization separation site)
9: visible light transmission region
11: barrier layer
12: positive C region-containing layer
13: positive C region
14: optically isotropic region

What is claimed is:

1. An organic EL image display device comprising:
a light emitting element substrate; and
a circularly polarizing plate,
wherein the light emitting element substrate includes a reflecting layer and an organic electroluminescent layer on the reflecting layer,
the reflecting layer, the organic electroluminescent layer, and the circularly polarizing plate are arranged in this order,
a polarization separation layer is provided between the organic electroluminescent layer and the circularly polarizing plate,
the polarization separation layer includes a polarization separation region that reflects light of one polarization state in light emitted from the organic electroluminescent layer, and transmits light of another polarization state, and a visible light transmission region,
the polarization separation region is formed of a layer formed by immobilizing a cholesteric liquid crystalline phase, and
a positive C region-containing layer is provided between the organic electroluminescent layer and the circularly polarizing plate,
wherein a retardation Rth(550) of a positive C region of the positive C region-containing layer in a film thickness direction at a wavelength of 550 nm is −250 nm to −70 nm;
wherein the positive C region-containing layer includes a positive C region, and an absolute value of a retardation Rth(X) of the positive C region in a film thickness direction at an arbitrary wavelength X nm in a visible light region is an arbitrary value between an absolute value of a retardation Rth-Ch(X) of the polarization separation region in a film thickness direction at the wavelength X nm and an absolute value of a retardation Rth-T(X) of the visible light transmission region at the wavelength X nm.

2. The organic EL image display device according to claim 1,
wherein a retardation Rth(550) of a positive C region of the positive C region-containing layer in a film thickness direction at a wavelength of 550 nm is −230 nm to −130 nm.

3. The organic EL image display device according to claim 1,
wherein the circularly polarizing plate includes a ¼ wavelength plate, a ½ wavelength phase difference plate, and a polarization layer in this order.

4. The organic EL image display device according to claim 1,
wherein the circularly polarizing plate includes a reverse wavelength dispersion A-plate and a polarization layer.

5. The organic EL image display device according to claim 1,
wherein the organic electroluminescent layer, the positive C region-containing layer, the polarization separation layer, and the circularly polarizing plate are arranged in this order.

6. The organic EL image display device according to claim 1,
wherein the visible light transmission region is prepared using a composition the same as a composition for preparing the polarization separation region.

7. The organic EL image display device according to claim 1,
wherein the visible light transmission region includes an optically isotropic region.

8. The organic EL image display device according to claim 6,
wherein the visible light transmission region is a layer formed by immobilizing a cholesteric liquid crystalline phase and has a center wavelength of selective reflection in an ultraviolet light wavelength range or an infrared light wavelength range.

9. The organic EL image display device according to claim 8,
wherein the positive C region-containing layer includes a positive C region, and
an absolute value of a retardation Rth(X) of the positive C region in a film thickness direction at an arbitrary wavelength X nm in a visible light region is equal to an absolute value of a retardation Rth(X) of the polarization separation region in a film thickness direction at the wavelength X nm.

10. The organic EL image display device according to claim 7,
wherein the positive C region-containing layer further includes, in addition to a positive C region, an optically isotropic region.

11. The organic EL image display device according to claim 10,
wherein an absolute value of a retardation Rth(X) of the positive C region in a film thickness direction at an arbitrary wavelength X nm in a visible light region is equal to an absolute value of a retardation Rth(X) of the polarization separation region in a film thickness direction at the wavelength X nm.

12. The organic EL image display device according to claim 1,
wherein the light emitting element substrate includes an organic electroluminescent layer group in which the organic electroluminescent layers are arranged in a matrix form on the reflecting layer.

13. The organic EL image display device according to claim 12,
wherein the polarization separation region is a set of polarization separation sites arranged in a matrix form corresponding to the organic electroluminescent layer group.

14. The organic EL image display device according to claim 13,
wherein the organic electroluminescent layer group includes an organic electroluminescent layer that emits light of two or more wavelengths, and
the polarization separation site reflects light of one polarization state in a wavelength range in which the organic electroluminescent layer arranged at the corresponding position emits light.

15. The organic EL image display device according to claim 13,
wherein the visible light transmission region includes an optically isotropic region,
the positive C region-containing layer includes the positive C region and an optically isotropic region, and
the positive C region has a matrix form corresponding to the polarization separation sites arranged in the matrix form.

16. The organic EL image display device according to claim 10,
wherein the light emitting element substrate includes an organic electroluminescent layer group in which the organic electroluminescent layers are arranged in a matrix form on the reflecting layer.

17. The organic EL image display device according to claim 16,
wherein the polarization separation region is a set of polarization separation sites arranged in a matrix form corresponding to the organic electroluminescent layer group.

18. The organic EL image display device according to claim 17,
wherein the organic electroluminescent layer group includes an organic electroluminescent layer that emits light of two or more wavelengths, and
the polarization separation site reflects light of one polarization state in a wavelength range in which the organic electroluminescent layer arranged at the corresponding position emits light.

19. The organic EL image display device according to claim 17,
wherein the visible light transmission region includes an optically isotropic region, and
the positive C region has a matrix form corresponding to the polarization separation sites arranged in the matrix form.

* * * * *